United States Patent
Azami et al.

(10) Patent No.: US 9,496,291 B2
(45) Date of Patent: Nov. 15, 2016

(54) PULSE OUTPUT CIRCUIT, SHIFT REGISTER AND DISPLAY DEVICE

(71) Applicant: SEMICONDUCTOR ENERGY LABORATORY CO., LTD., Atsugi-shi, Kanagawa-ken (JP)

(72) Inventors: Munehiro Azami, Kanagawa (JP); Shou Nagao, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/816,124

(22) Filed: Aug. 3, 2015

(65) Prior Publication Data

US 2015/0340378 A1    Nov. 26, 2015

Related U.S. Application Data

(63) Continuation of application No. 14/332,468, filed on Jul. 16, 2014, now Pat. No. 9,105,520, which is a (Continued)

(30) Foreign Application Priority Data

May 11, 2001    (JP) ................................. 2001-141347

(51) Int. Cl.
   *H01L 27/12*       (2006.01)
   *G02F 1/133*       (2006.01)
   (Continued)

(52) U.S. Cl.
   CPC ........... *H01L 27/124* (2013.01); *G02F 1/1333* (2013.01); *G02F 1/13306* (2013.01);
   (Continued)

(58) Field of Classification Search
   USPC ....... 345/76–79, 82, 84, 87, 92, 98, 99, 100, 345/102, 104, 204, 211–214
   See application file for complete search history.

(56) References Cited

U.S. PATENT DOCUMENTS 3,506,851 A    4/1970    Polkinghorn et al.
3,774,055 A    11/1973   Bapat
(Continued)

FOREIGN PATENT DOCUMENTS

EP    0801376 A    10/1997
EP    1063630 A    12/2000
(Continued)

OTHER PUBLICATIONS

Office Action (Application No. 02119181.6) Dated May 25, 2007.
Search Report (Application No. 200202969.2) Dated Apr. 27, 2004.

*Primary Examiner* — Tuyet Vo
(74) *Attorney, Agent, or Firm* — Fish & Richardson P.C.

(57) ABSTRACT

A pulse is inputted to TFTs 101 and 104 so that the TFTs would turn ON and then potential of a node α rises. When the potential of the node α reaches (VDD−VthN), the node α became in a floating state. Accordingly, a TFT 105 then turns ON, and potential of an output node rises as a clock signal reaches the level H. On the other hand, potential of a gate electrode of the TFT 105 further rises due to an operation of capacitance 107 as the potential of the output node rises, so that the potential of the output node would be higher than (VDD+VthN). Thus, the potential of the output node rises to VDD without voltage drop caused by a threshold of the TFT 105.

32 Claims, 17 Drawing Sheets

Related U.S. Application Data continuation of application No. 13/604,709, filed on Sep. 6, 2012, now Pat. No. 8,786,533, which is a continuation of application No. 12/575,642, filed on Oct. 8, 2009, now Pat. No. 8,264,445, which is a continuation of application No. 11/420,404, filed on May 25, 2006, now Pat. No. 7,710,384, which is a continuation of application No. 10/127,600, filed on Apr. 23, 2002, now Pat. No. 7,057,598.

(51) Int. Cl.
*G09G 3/36* (2006.01)
*G11C 19/28* (2006.01)
*G02F 1/1333* (2006.01)

(52) U.S. Cl.
CPC ............ *G09G 3/3688* (2013.01); *G11C 19/28* (2013.01); *H01L 27/1214* (2013.01); *G09G 2330/021* (2013.01)

(56) References Cited

U.S. PATENT DOCUMENTS

| | | |
|---|---|---|
| 3,898,479 A | 8/1975 | Proebsting |
| 4,090,096 A | 5/1978 | Nagami |
| 4,129,794 A | 12/1978 | Dickson et al. |
| 4,390,803 A | 6/1983 | Koike |
| 4,412,139 A | 10/1983 | Horninger |
| 4,633,105 A | 12/1986 | Tsujimoto |
| 4,804,870 A | 2/1989 | Mahmud |
| 4,959,697 A | 9/1990 | Shier et al. |
| 5,222,082 A | 6/1993 | Plus |
| 5,397,984 A | 3/1995 | Koshikawa |
| 5,467,038 A | 11/1995 | Motley et al. |
| 5,548,143 A | 8/1996 | Lee |
| 5,552,723 A | 9/1996 | Shigehara et al. |
| 5,643,826 A | 7/1997 | Ohtani et al. |
| 5,646,516 A | 7/1997 | Tobita |
| 5,694,061 A | 12/1997 | Morosawa et al. |
| 5,859,630 A | 1/1999 | Huq |
| 5,870,071 A | 2/1999 | Kawahata |
| 5,889,291 A | 3/1999 | Koyama et al. |
| 5,949,271 A | 9/1999 | Fujikura |
| 5,949,398 A | 9/1999 | Kim |
| 5,952,991 A | 9/1999 | Akiyama |
| 6,040,810 A | 3/2000 | Nishimura |
| 6,049,228 A | 4/2000 | Moon |
| 6,091,393 A | 7/2000 | Park |
| 6,275,210 B1 | 8/2001 | Maekawa |
| 6,384,804 B1 | 5/2002 | Dodabalapur et al. |
| 6,426,743 B1 | 7/2002 | Yeo et al. |
| 6,501,098 B2 | 12/2002 | Yamazaki |
| 6,522,323 B1 | 2/2003 | Sasaki et al. |
| 6,542,138 B1 | 4/2003 | Shannon et al. |
| 6,556,646 B1 | 4/2003 | Yeo et al. |
| 6,611,248 B2 | 8/2003 | Kanbara et al. |
| 6,686,899 B2 | 2/2004 | Miyazawa et al. |
| 6,813,332 B2 | 11/2004 | Nagao et al. |
| 6,928,136 B2 | 8/2005 | Nagao et al. |
| 6,975,142 B2 | 12/2005 | Azami et al. |
| 7,057,598 B2 | 6/2006 | Azami et al. |
| 7,586,478 B2 | 9/2009 | Azami et al. |
| 7,710,384 B2 | 5/2010 | Azami et al. |
| 8,654,056 B2 | 2/2014 | Otose et al. |
| 2001/0002703 A1 | 6/2001 | Koyama |
| 2001/0045565 A1 | 11/2001 | Yamazaki |
| 2002/0011973 A1 | 1/2002 | Komiya |
| 2002/0044208 A1 | 4/2002 | Yamazaki et al. |
| 2002/0097212 A1 | 7/2002 | Miyazawa et al. |
| 2002/0158666 A1 | 10/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |

FOREIGN PATENT DOCUMENTS

| | | |
|---|---|---|
| EP | 1139326 A | 10/2001 |
| EP | 1253718 A | 10/2002 |
| JP | 52-048458 A | 4/1977 |
| JP | 55-156427 A | 12/1980 |
| JP | 56-093431 A | 7/1981 |
| JP | 59-016424 A | 1/1984 |
| JP | 59-225613 A | 12/1984 |
| JP | 60-140924 A | 7/1985 |
| JP | 63-056016 A | 3/1988 |
| JP | 63-204815 A | 8/1988 |
| JP | 03-163911 A | 7/1991 |
| JP | 03-165171 A | 7/1991 |
| JP | 05-037336 A | 2/1993 |
| JP | 05-136683 A | 6/1993 |
| JP | 06-098081 A | 4/1994 |
| JP | 06-505605 | 6/1994 |
| JP | 09-018011 A | 1/1997 |
| JP | 09-036729 A | 2/1997 |
| JP | 09-046216 A | 2/1997 |
| JP | 09-186312 A | 7/1997 |
| JP | 09-246936 A | 9/1997 |
| JP | 10-031202 A | 2/1998 |
| JP | 2000-106617 A | 4/2000 |
| JP | 2000-155550 A | 6/2000 |
| JP | 2001-005426 A | 1/2001 |
| JP | 2001-060398 A | 3/2001 |
| JP | 2001-101889 A | 4/2001 |
| JP | 2001-109394 A | 4/2001 |
| JP | 2001-133431 A | 5/2001 |
| JP | 2001-506044 | 5/2001 |
| JP | 2002-176162 A | 6/2002 |
| JP | 2002-251164 A | 9/2002 |
| JP | 2002-328643 A | 11/2002 |
| WO | WO-98/26423 | 6/1998 |

CK : clock singal
CKB : clock reverse signal
SP : start pulse

CK : clock signal
CKB : clock reverse signal
SP : start pulse
LR : scan direction switch signal
LRB : scan direction switch reverse signal CK : clock signal
CKB : clock reverse signal
SP : start pulse CK : clock signal
CKB : clock reverse signal
SP : start pulse
Res : reset signal CK : clock signal
CKB : clock reverse signal
SP : start pulse
Res : reset signal CK : clock signal
CKB : clock reverse signal
SP : start pulse

PULSE OUTPUT CIRCUIT, SHIFT REGISTER AND DISPLAY DEVICE

CROSS-REFERENCE TO RELATED APPLICATIONS

This application is a continuation of U.S. application Ser. No. 14/332,468, filed Jul. 16, 2014, now allowed, which is a continuation of U.S. application Ser. No. 13/604,709, filed Sep. 6, 2012, now U.S. Pat. No. 8,786,533, which is a continuation of U.S. application Ser. No. 12/575,642, filed Oct. 8, 2009, now U.S. Pat. No. 8,264,445, which is a continuation of U.S. application Ser. No. 11/420,404, filed May 25, 2006, now U.S. Pat. No. 7,710,384, which is a continuation of U.S. application Ser. No. 10/127,600, filed Apr. 23, 2002, now U.S. Pat. No. 7,057,598, which claims the benefit of a foreign priority application filed in Japan as Serial No. 2001-141347 on May 11, 2001, all of which are incorporated by reference.

BACKGROUND OF THE INVENTION

Field of the Invention

The present invention relates to a pulse output circuit, a shift register and a display device. In this specification, it is defined that a display device includes a liquid crystal display device in which liquid crystal elements are used as pixels and a spontaneous luminous display device in which spontaneous luminous elements such as electro-luminescence (EL) elements are used. It is also defined that a drive circuit of the display device is a circuit for inputting an image signal into a pixel disposed in the display device to carry out a process of displaying an image and includes a pulse output circuit such as shift register and inverter and an amplification circuit such as amplifier.

Description of the Related Art

Recently, a display device in which a semiconductor thin film is formed on an insulating material, especially on a glass plate, particularly an active matrix type of display device using a thin film transistor (referred to as a TFT, hereinafter) has been popular. The active matrix type of display device using TFTs contains hundred thousands to millions of pixels arranged in the shape of a matrix and displays an image by controlling an electric charge of each pixel by means of a TFT disposed in each pixel.

Further, as a recent technology, there has been a technology developed, which relates to, other than a pixel TFT forming a pixel, a poly-silicon TFT in which a TFT is used in a peripheral area of a pixel portion to simultaneously form a drive circuit. This technology greatly contributes to downsizing and consumed power reducing of a device. Accordingly, a display device is an essential device to a display part of a mobile information terminal whose application field has been significantly increased recently.

A CMOS circuit, which is produced by combining an N-channel type of TFT and a P-channel type of TFT, is generally used as a circuit, which forms a drive circuit of a display device. Now a shift register will be described as an example of the CMOS circuit conventionally used in general. FIG. 11A illustrates an example of a shift register conventionally used and a part enclosed by a dotted line frame 1100 is a circuit for outputting one stage of pulses. In FIG. 11A, three stages of pulses are extracted to be shown. One stage of a circuit comprises clocked inverters 1101 and 1103 and an inverter 1102. A detailed structure of the circuit is shown in FIG. 11B. In FIG. 11B, the clocked inverter 1101 comprises TFTs 1104 to 1107; the inverter 1102 comprises TFTs 1108 and 1109; and the clocked inverter 1103 comprises TFTs 1110 to 1113.

The TFTs forming a circuit includes three electrodes of a gate electrode, a source electrode and a drain electrode. Generally, in the CMOS circuit, the N-channel type of TFT often uses a lower potential part as the source electrode and a higher potential part as the drain electrode, while the P-channel type of TFT often uses a higher potential part as the source electrode and a lower potential part as the drain electrode. Thus, one of the source electrode and the drain electrode is referred to as a first electrode and the other is referred to as a second electrode in order to prevent confusion in describing connection of TFTs in this specification.

An operation of the circuit will be now described. As for an operation of a TFT, a conductive condition where a channel is formed between impurity regions when potential is given to a gate electrode is referred to as ON, while a non-conductive condition where the channel between impurity regions are erased is referred to as OFF.

Refer to a timing chart shown in FIGS. 11A, 11B and 11C. A clock signal (referred to as a CK, hereinafter) and a clock reverse signal (referred to as a CKB, hereinafter) are respectively inputted to the TFTs 1107 and 1104. A start pulse (referred to as a SP, hereinafter) is inputted to the TFTs 1105 and 1106. When the CK is at an level H, the CKB is at a level L and the SP is at the level H, the TFTs 1106 and 1107 turn ON, an output at the level L is inputted into an inverter comprising the TFTs 1108 and 1109 and reversed to be outputted at the level H to an output node (SR out 1). Then, when the CK reaches the level L and the CKB reaches the level H while the SP is at the level H, a holding operation is taken in a loop comprising an inverter 1102 and a clocked inverter 1103. Thus, an output at the level H is continuously outputted to the output node. Next, when the CK reaches the level H and the CKB reaches the level L, a writing operation is taken in the clocked inverter 1101 again. An output at the level L is outputted to the output node since the SP has already reached to the level L at that time. After this, when the CK reaches the level L and the CKB reaches the level H, the holding operation is taken again. The level L in the output node is held in the loop comprising the inverter 1102 and the clocked inverter 1103.

The above is an operation for one stage. Connection of the CK and the CKB is contrary in a subsequent stage, so that the polarity of the clock signal would be contrary to the above while an operation would be similar. The above is repeated alternately, and a sampling pulse is similarly outputted in order as shown in FIG. 11C thereafter.

A characteristic of a CMOS circuit is that it is possible to keep the consumed current down in the circuit as a whole since electric current flows only at a moment that logic is changed (from the level H to the level L, or from the level L to the level H) and does not flow while certain logic is held (although there is minute leak current in practice).

SUMMARY OF THE INVENTION

Demand for a display device using liquid crystal or spontaneous luminous elements is rapidly increasing as a mobile electronic apparatus is downsized and lightened in weight. It is difficult, however, to keep a manufacturing cost of the display device down sufficiently in view of a yield. It is easily forecasted that a future demand would more rapidly increase, and therefore, supply of a display device at a low price is desired.

A general method for forming a drive circuit on an insulating material is to perform exposure and etching of a pattern such as an activation layer and a wiring by means of plural photo-masks to form the circuit. The number of processes in manufacturing is ideally as few as possible since it directly influences a manufacturing cost. When the drive circuit conventionally comprising a CMOS circuit can be formed only by means of conductive TFTs, which are either one of the N-channel type or the P-channel type, a part of an ion-doping process can be omitted as well as the number of photo-masks can be reduced.

FIG. 9A illustrates an example of a CMOS inverter (I) conventionally used in general and inverters (II) and (III) comprising single conductive TFTs. (II) is a TFT load type of an inverter and (III) is a resistance load type of an inverter. Respective operations will be described hereinafter.

FIG. 9B shows a waveform of a signal to be inputted to an inverter. The amplitude of an input signal is here defined to be VDD−VSS (VSS<VDD). It is assumed here that VSS=0 [V].

An operation of a circuit will be described. The threshold voltage of an N type of TFTs composing the circuit is assumed to be uniform (VthN) without any dispersion for the purpose of clear and simple description. Similarly, the threshold voltage of a P type of TFTs is also assumed to be uniform (VthP).

When a signal as shown in FIG. 9B is inputted to a CMOS inverter (I), in the case that potential of the inputted signal is at the level H, a P type of a TFT 901 turns OFF and an N type of a TFT 902 turns ON. Thereby potential of an output node reaches the level L. To the contrary, in the case that the potential of the inputted signal is the level L, the P type of TFT 901 turns ON and the N type of TFT 902 turns OFF. Thereby, the potential of the output node reaches the level H when (FIG. 9C).

An operation of the TFT load type of inverter (II) will be described subsequently. It is assumed that a signal as shown in FIG. 9B is inputted similarly to the above inverter. An N type of TFT 904 turns OFF when the inputted signal is at the level L. The potential of the output node is raised up toward the level H since a load TFT 903 always operates in saturation. On the other hand, the N type of TFT 904 turns ON when the inputted signal is at the level H. The potential of the output node is reduced toward the level L when the electric current capability of the N type of TFT 904 is set to be sufficiently higher than that of the load TFT 903.

That is the case of the resistance load type of inverter (III). When an ON resistance value of an N type of TFT 906 is set to be sufficiently lower than a resistance value of load resistance 905, the N type of TFT 906 turns ON in the case that the inputted signal is at the level H, and thereby, the output node is reduced toward the level L. The N type of TFT 906 turns OFF in the case that the inputted signal is at the level L, so that the output node would be raised up toward the level H.

There are following problems, however, in using a TFT load type of inverter (II) or a resistance load type of inverter (III). FIG. 9D shows an output waveform of a TFT load type of inverter (II). The potential is lower than VDD for the amount shown by 907 when the output is at the level H. When it is defined that a terminal on an output node side is a source and a terminal on a power supply VDD side is drain in the load TFT 903, the potential of a gate electrode is VDD since the gate electrode and a drain area are connected. The potential of the output node rises only up to VDD−VthN at most since the condition to keep ON of the load TFT is (Voltage between the gate and source of the TFT

903>VthN). That is, 907 is equal to VthN. Furthermore, the potential may be higher than VSS for the amount shown by 908 when the output potential is the level L, depending on a rate of the electric current capability of the load TFT 903 and the N type TFT 904. The electric current capability of the N type TFT 904 should be sufficiently higher than that of the load TFT 903 in order to make the potential, which is higher than VSS, sufficiently close to VSS. FIG. 9E shows an output waveform of a resistance load type of inverter (III). Similarly to the above, the potential may be higher for the amount shown by 909, depending on a rate of a resistance value of load resistance 905 and ON resistance of an N type of TFT 906. That is, using an inverter comprising only single conductive TFTs shown here causes amplitude attenuation of an output signal with respect to amplitude of an input signal.

In the case of a circuit in which a preceding stage of output pulse is inputted to the subsequent stage, such as a shift register, amplitude is attenuated in accordance with a threshold value of a TFT as a stage increases from the m, m+1, m+2, . . . , so that the circuit would not work.

In view of the above problems, a purpose of the invention is to provide a pulse output circuit and a shift register capable of manufacturing at a low cost by using only single conductive TFTs to reduce manufacturing processes and capable of obtaining an output without amplitude attenuation.

A condition is considered such that amplitude of an output signal can be normally VDD−VSS in the above-mentioned TFT load type of inverter shown by (II) in FIG. 9A. First, when potential of an output signal reaches the level L in a circuit shown in FIG. 10A, a resistance value between the power supply VSS and the output node is only required to be sufficiently low with respect to a resistance value between the power supply VDD and the output node in order to make the potential sufficiently close to VSS. That is, an N type of TFT 1001 is only required to be OFF while an N type of TFT 1002 is ON. Second, an absolute value of a voltage between a gate and a source of the N type of TFT 1001 is only required to be always more than VthN for the purpose that the potential of an output signal is equal to VDD when the potential reaches the level H. That is, the potential of a gate electrode of the N type of TFT 1001 must be higher than (VDD+VthN) in order to satisfy a condition that the level H of the output node is VDD. There are only two kinds of power supplied to the circuit: VDD and VSS. Thus, the above condition cannot be satisfied by a conventional method as long as there is no third power supply whose potential is higher than VDD.

In order to overcome the above, the following measures are taken in the invention. As shown in FIG. 10B, a capacity means 1003 is provided between the gate and the source of the N type of TFT 1001. When the potential of the output node is raised up at the time that the gate electrode of the N type of TFT 1001 is in a floating state with certain potential, the potential of the gate electrode of the N type of TFT 1001 is also raised up in accordance with a rising amount of the potential of the output node due to capacity combination by the capacity means 1003. It is possible to make the potential of the gate electrode of the N type of TFT 1001 higher than VDD (more accurately, higher than VDD+VthN) by using the above effect. Therefore, it is possible to rise up the potential of the output node to VDD sufficiently.

Capacity parasitizing between the gate and the source of the TFT 1001 may be used as the capacity means 1003 shown in FIG. 10B, as well as a capacity means may be produced in practice. In the case of producing the capacity means independently, it is easy and preferable to use any two of an activation layer, a gate material and a wiring material to sandwich an insulating layer therebetween, but other materials may also be used.

Structures of the invention will be now descried.

The pulse output circuit according to the invention is a pulse output circuit comprising:

a first transistor having a first electrode electrically connected to a first input signal line;

a second transistor having a first electrode electrically connected to first power supply;

a first amplitude compensation circuit;

a second amplitude compensation circuit; and a capacitance, wherein the first transistor and the second transistor have a same conductive type, a second electrode of the first transistor, a second electrode of the second transistor and a first terminal of the capacitance are electrically connected to an output signal line, a gate electrode of the first transistor is electrically connected to a second terminal of the capacitance, a gate electrode of the first transistor is electrically connected to an output portion of the first amplitude compensation circuit, a gate electrode of the second transistor is electrically connected to an output portion of the second amplitude compensation circuit, each of a second signal input portion and a third signal input portion is electrically connected to a first input portion and a second input portion of the first amplitude compensation circuit, and each of the second signal input portion and the third signal input portion is electrically connected to a first input portion and a second input portion of the second amplitude compensation circuit.

The pulse output circuit according to the invention is a pulse output circuit comprising:

a first transistor having a first electrode electrically connected to a first input signal line;

a second transistor having a first electrode electrically connected to first power supply;

an amplitude compensation circuit; and a capacitance, wherein the first transistor and the second transistor have a same conductive type, a second electrode of the first transistor, a second electrode of the second transistor and a first terminal of the capacitance are electrically connected to an output signal line, a gate electrode of the second transistor is electrically connected to an output portion of the second amplitude compensation circuit, a gate electrode of the first transistor is electrically connected to an output portion of the amplitude compensation circuit, each of a second signal input portion and a third signal input portion is electrically connected to a first input portion and a second input portion of the amplitude compensation circuit, and a gate electrode of the second transistor is electrically connected to the third input signal line.

The pulse output circuit according to the invention is a pulse output circuit comprising:

a first transistor having a first electrode electrically connected to a first input signal line;

a second transistor having a first electrode electrically connected to first power supply, a third transistor having a first electrode electrically connected to second power supply;

a fourth transistor having a first electrode electrically connected to the first power supply;

a fifth transistor having a first electrode electrically connected to the second power supply;

a sixth transistor having a first electrode electrically connected to the first power supply, and a capacitance, wherein all the first to sixth transistors have a same conductive type, a second electrode of the first transistor, a second electrode of the second transistor and a first terminal of the capacitance are electrically connected to an output signal line, a second electrode of the third transistor, a second electrode of the fourth transistor and a gate electrode of the first transistor are electrically connected to a second terminal of the capacitance, a second electrode of the fifth transistor and a second electrode of the sixth transistor are electrically connected to a gate electrode of the second transistor, a gate electrode of the third transistor and a gate electrode of the sixth transistor are electrically connected to a second input signal line, and a gate electrode of the fourth transistor and a gate electrode of the fifth transistor are electrically connected to a third input signal line.

The pulse output circuit according to the invention is a pulse output circuit comprising:

a first transistor having a first electrode electrically connected to a first input signal line;

a second transistor having a first electrode electrically connected to first power supply;

a third transistor having a first electrode electrically connected to second power supply;

a fourth transistor having a first electrode electrically connected to the first power supply; and a capacitance, wherein all the first to fourth transistors have a same conductive type, a second electrode of the first transistor, a second electrode of the second transistor and a first terminal of the capacitance are electrically connected to an output signal line, a second electrode of the third transistor, a second electrode of the fourth transistor and a gate electrode of the first transistor are electrically connected to a second terminal of the capacitance, a gate electrode of the third transistor is electrically connected to a second input signal line, and a gate electrode of the second transistor and a gate electrode of the fourth transistor are electrically connected to a third input signal line.

The pulse output circuit according to the invention is a pulse output circuit comprising:

a first transistor having a first electrode electrically connected to a first input signal line;

a second transistor having a first electrode electrically connected to first power supply;

a third transistor having a first electrode electrically connected to second power supply;

a fourth transistor having a first electrode electrically connected to the first power supply;

a fifth transistor having a first electrode electrically connected to the second power supply;

a sixth transistor having a first electrode electrically connected to the first power supply;

a seventh transistor having a first electrode electrically connected to the second power supply;

an eighth transistor having a first electrode electrically connected to the first power supply; and a capacitance, wherein all the first to eighth transistors have a same conductive type, a second electrode of the first transistor, a second electrode of the second transistor and a first terminal of the capacitance are electrically connected to an output signal line, a second electrode of the third transistor, a second electrode of the fourth transistor, a second electrode of the eighth transistor and a gate electrode of the first transistor are electrically connected to a second terminal of the capacitance, a second electrode of the fifth transistor, a second electrode of the sixth transistor and a second electrode of the seventh transistor are electrically connected to a gate electrode of the second transistor, a gate electrode of the third transistor and a gate electrode of the sixth transistor are electrically connected to a second input signal line, a gate electrode of the fourth transistor and a gate electrode of the fifth transistor are electrically connected to a third input signal line, and a gate electrode of the seventh transistor and a gate electrode of the eighth transistor are electrically connected to a fourth input signal line.

The pulse output circuit according to the invention is a pulse output circuit comprising:

a first transistor having a first electrode electrically connected to a first input signal line;

a second transistor having a first electrode electrically connected to first power supply;

a third transistor having a first electrode electrically connected to second power supply;

a fourth transistor having a first electrode electrically connected to the first power supply;

a fifth transistor having a first electrode electrically connected to the second power supply;

a sixth transistor having a first electrode electrically connected to the first power supply;

a capacitance; and a scan direction switch circuit, wherein all the first to sixth transistors have a same conductive type, a second electrode of the first transistor, a second electrode of the second transistor and a first terminal of the capacitance are all electrically connected to an output signal line, a second electrode of the third transistor, a second electrode of the fourth transistor and a gate electrode of the first transistor are all electrically connected to a second terminal of the capacitance, a second electrode of the fifth transistor and a second electrode of the sixth transistor are electrically connected to a gate electrode of the second transistor, a gate electrode of the third transistor and a gate electrode of the sixth transistor are electrically connected to a second input signal line and a third input signal line through the scan direction switch circuit, a gate electrode of the fourth transistor and a gate electrode of the fifth transistor are electrically connected to the second input signal line and the third input signal line through the scan direction switch circuit, the gate electrode of the third transistor and the gate electrode of the sixth transistor are conductive to the second input signal line and non-conductive to the third input signal line while the gate electrode of the fourth transistor and the gate electrode of the fifth transistor are conductive to the third input signal line and non-conductive to the second input signal line, when the scan direction switch circuit is in a first condition, and the gate electrode of the third transistor and the gate electrode of the sixth transistor are conductive to the third input signal line and non-conductive to the second input signal line while the gate electrode of the fourth transistor and the gate electrode of the fifth transistor are conductive to the second input signal line and non-conductive to the third input signal line, when the scan direction switch circuit is in a second condition.

The pulse output circuit according to the invention is a pulse output circuit comprising:

a first transistor having a first electrode electrically connected to a first input signal line;

a second transistor having a first electrode electrically connected to first power supply;

a third transistor having a first electrode electrically connected to second power supply;

a fourth transistor having a first electrode electrically connected to the first power supply;

a capacitance; and a scan direction switch circuit, wherein all the first to fourth transistors have a same conductive type, a second electrode of the first transistor, a second electrode of the second transistor and a first terminal of the capacitance are all electrically connected to an output signal line, a second electrode of the third transistor, a second electrode of the fourth transistor and a gate electrode of the first transistor are all electrically connected to a second terminal of the capacitance, a gate electrode of the third transistor is electrically connected to a second input signal line and a third input signal line through the scan direction switch circuit, a gate electrode of the second transistor and a gate electrode of the fourth transistor are electrically connected to the second input signal line and the third input signal line through the scan direction switch circuit, the gate electrode of the third transistor is conductive to the second input signal line and non-conductive to the third input signal line while the gate electrode of the second transistor and the gate electrode of the fourth transistor are conductive to the third input signal line and non-conductive to the second input signal line, when the scan direction switch circuit is in a first condition, and the gate electrode of the third transistor is conductive to the third input signal line and non-conductive to the second input signal line while the gate electrode of the second transistor and the gate electrode of the fourth transistor are conductive to the second input signal line and non-conductive to the third input signal line, when the scan direction switch circuit is in a second condition.

The pulse output circuit according to the invention is a pulse output circuit comprising:

a first transistor having a first electrode electrically connected to a first input signal line;

a second transistor having a first electrode electrically connected to first power supply;

a third transistor having a first electrode electrically connected to second power supply;

a fourth transistor having a first electrode electrically connected to the first power supply;

a fifth transistor having a first electrode electrically connected to the second power supply;

a sixth transistor having a first electrode electrically connected to the first power supply;

a seventh transistor having a first electrode electrically connected to the second power supply;

an eighth transistor having a first electrode electrically connected to the first power supply;

a capacitance; and a scan direction switch circuit, wherein all the first to eighth transistors have a same conductive type, a second electrode of the first transistor, a second electrode of the second transistor and a first terminal of the capacitance are all electrically connected to an output signal line, a second electrode of the third transistor, a second electrode of the fourth transistor, a second electrode of the eighth transistor and a gate electrode of the first transistor are electrically connected to a second terminal of the capacitance, a second electrode of the fifth transistor, a second electrode of the sixth transistor and a second electrode of the seventh transistor are electrically connected to a gate electrode of the second transistor, a gate electrode of the third transistor and a gate electrode of the sixth transistor are both electrically connected to a second input signal line and a third input signal line through the scan direction switch circuit, a gate electrode of the fourth transistor and a gate electrode of the fifth transistor are electrically connected to the second input signal line and the third input signal line through the scan direction switch circuit, a gate electrode of the seventh transistor and a gate electrode of the eighth transistor are electrically connected to a fourth input signal line, the gate electrode of the third transistor and the gate electrode of the sixth transistor are conductive to the second input signal line and non-conductive to the third input signal line while the gate electrode of the fourth transistor and the gate electrode of the fifth transistor are conductive to the third input signal line and non-conductive to the second input signal line, when the scan direction switch circuit is in a first condition, and the gate electrode of the third transistor and the gate electrode of the sixth transistor are conductive to the third input signal line and non-conductive to the second input signal line while the gate electrode of the fourth transistor and the gate electrode of the fifth transistor are conductive to the second input signal line and non-conductive to the third input signal line, when the scan direction switch circuit is in a second condition.

In the pulse output circuit according to the invention, the scan direction switch circuit comprises:

a seventh transistor having a first electrode electrically connected to the second input signal line;

an eighth transistor having a first electrode electrically connected to the second input signal line;

a ninth transistor having a first electrode electrically connected to the third input signal line; and a tenth transistor having a first electrode electrically connected to the third input signal line, and wherein the seventh to tenth transistors have a same conductive type as the first to sixth transistors, a second electrode of the seventh transistor, a second electrode of the ninth transistor and the gate electrode of the third transistor are electrically connected to the gate electrode of the sixth transistor, a second electrode of the eighth transistor, a second electrode of the tenth transistor and the gate electrode of the fourth transistor are electrically connected to the gate electrode of the fifth transistor, a gate electrode of the seventh transistor and a gate electrode of the tenth transistor are electrically connected to a fourth input signal line, a gate electrode of the eighth transistor and a gate electrode of the ninth transistor are electrically connected to a fifth input signal line, the seventh transistor and the tenth transistor are conductive and the eighth transistor and the ninth transistor are non-conductive, when a scan direction switch signal is inputted to the fourth input signal line and a reverse signal of the scan direction switch signal is inputted to the fifth input signal line, and the eighth transistor and the ninth transistor are conductive and the seventh transistor and the tenth transistor re non-conductive, when the scan direction switch signal is inputted to the fifth input signal line and the reverse signal of the scan direction switch signal is inputted to the fourth input signal line.

In the pulse output circuit according to the invention, the scan direction switch circuit comprises:

a fifth transistor having a first electrode electrically connected to the second input signal line;

a sixth transistor having a first electrode electrically connected to the second input signal line;

a seventh transistor having a first electrode electrically connected to the third input signal line; and an eighth transistor having a first electrode electrically connected to the third input signal line, and wherein the fifth to eighth transistors have a same conductive type as the first to fourth transistors, a second electrode of the fifth transistor and a second electrode of the seventh transistor are both electrically connected to the gate electrode of the third transistor, a second electrode of the sixth transistor, a second electrode of the eighth transistor and the gate electrode of the second transistor are all electrically connected to the gate electrode of the fourth transistor, a gate electrode of the fifth transistor and a gate electrode of the eighth transistor are both electrically connected to a fourth input signal line, a gate electrode of the sixth transistor and a gate electrode of the seventh transistor are both electrically connected to a fifth input signal line, the fifth transistor and the eighth transistor are conductive and the sixth transistor and the seventh transistor are non-conductive, when a scan direction switch signal is inputted to the fourth input signal line and a reverse signal of the scan direction switch signal is inputted to the fifth input signal line, and the sixth transistor and the seventh transistor are conductive and the fifth transistor and the eighth transistor are non-conductive, when the scan direction switch signal is inputted to the fifth input signal line and the reverse signal of the scan direction switch signal is inputted to the fourth input signal line.

In the pulse output circuit according to the invention, the scan direction switch circuit comprises:

a ninth transistor having a first electrode electrically connected to the second input signal line;

a tenth transistor a first electrode electrically connected to the second input signal line;

an eleventh transistor a first electrode electrically connected to the third input signal line; and a twelfth transistor a first electrode electrically connected to the third input signal line;

and wherein the ninth to twelfth transistors have a same conductive type as the first to eighth transistors wherein a second electrode of the ninth transistor, a second electrode of the eleventh transistor and the gate electrode of the third transistor are electrically connected to the gate electrode of the sixth transistor, a second electrode of the tenth transistor, a second electrode of the twelfth transistor and the gate electrode of the fourth transistor are all electrically connected to the gate electrode of the fifth transistor, a gate electrode of the ninth transistor and a gate electrode of the twelfth transistor are both electrically connected to a fifth input signal line, a gate electrode of the tenth transistor and a gate electrode of the eleventh transistor are both electrically connected to a sixth input signal line, the ninth transistor and the twelfth transistor are conductive and the tenth transistor and the eleventh transistor are non-conductive, when a scan direction switch signal is inputted to the fourth input signal line and a reverse signal of the scan direction switch signal is inputted to the fifth input signal line, and the tenth transistor and the eleventh transistor are conductive and the ninth transistor and the twelfth transistor are non-conductive, when the scan direction switch signal is inputted to the fifth input signal line and the reverse signal of the scan direction switch signal is inputted to the fourth input signal line.

In the pulse output circuit according to the invention, the capacitance uses a capacity between the gate electrode of the first transistor and the second electrode of the first transistor.

In the pulse output circuit according to the invention, the capacitance comprises two material selected from the group consisting of an active layer material, a material forming a gate electrode and a wiring material.

The shift register according to the invention is a shift register comprising n stages (wherein n is a natural number and 1<n) of the pulse output circuit, wherein, in the pulse output circuit at the first stage, a clock signal or a clock reverse signal is inputted to the first input signal line, a start pulse is inputted to the second input signal line, and an output signal from the pulse output circuit at the second stage is inputted to the third input signal line, in the pulse output circuit at the m$^{th}$ stage (wherein m is a natural number and 2 m n−1), a clock signal or a clock reverse signal is inputted to the first input signal line, an output signal from the pulse output circuit at the (m−1)$^{th}$ stage is inputted to the second input signal line, and an output signal from the pulse output circuit at the (m+1)$^{th}$ stage is inputted to the third input signal line, and in the pulse output circuit at the n$^{th}$ stage, a clock signal or a clock reverse signal is inputted to the first input signal line, an output signal from the pulse output circuit at the (n−1)$^{th}$ stage is inputted to the second input signal line, and one of first power supply, a reset signal and the start pulse is inputted to the third input signal line, and wherein a sampling pulse is outputted in order according to the clock signal or the clock reverse signal and the start pulse.

In the pulse output circuit according to the invention, the conductive type is an N-channel type.

In the pulse output circuit according to the invention, the conductive type is a P-channel type.

In the shift register according to the invention, the conductive type is an N-channel type.

In the pulse output circuit according to the invention, the conductive type is a P-channel type.

DETAILED DESCRIPTION OF THE INVENTION

Embodiment Mode 1

Figure 1A:
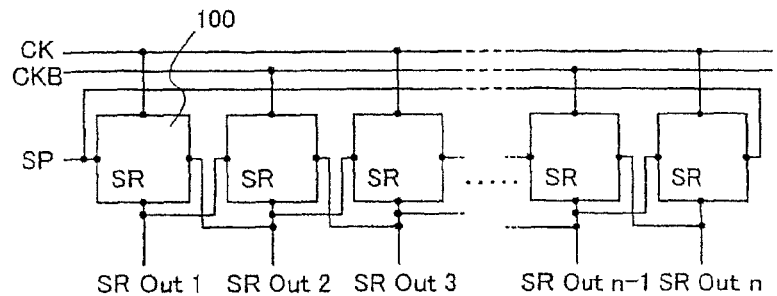
FIGS. 1A through 1C illustrate one embodiment mode of a pulse output circuit according to the invention.
Figure 1B:
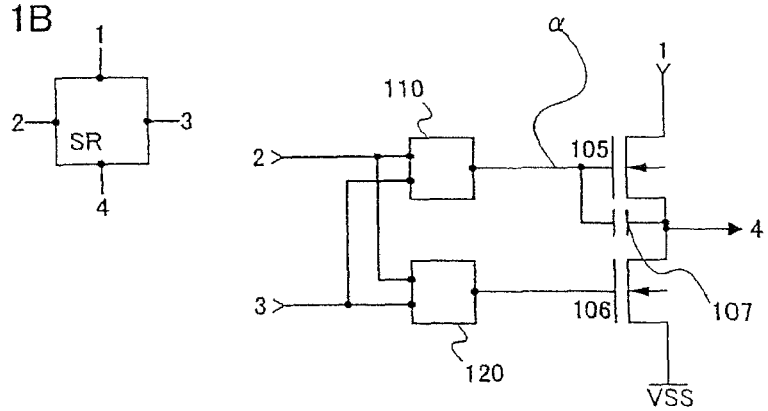
Figure 1C:
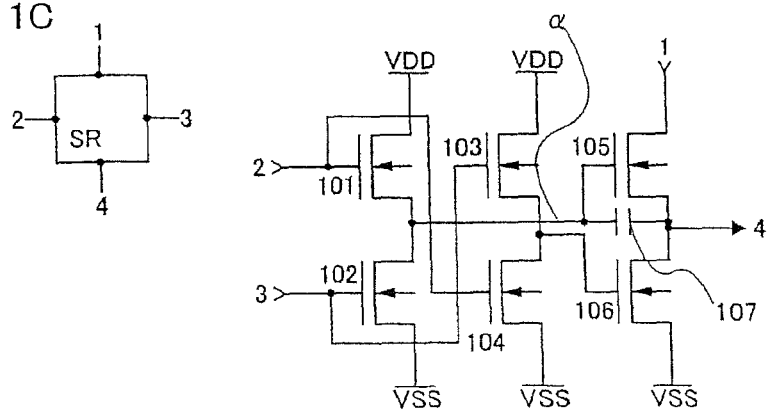

FIG. 1 illustrates a shift register to which a bootstrap manner is applied, which is in a mode of a pulse output circuit according to the invention. In a block diagram shown in FIG. 1A, a block shown by 100 is a pulse output circuit for outputting one stage of sampling pulses. A shift register shown in FIG. 1A comprises n stages of pulse output circuits. A clock signal (referred to as a CK, hereinafter), a clock reverse signal (referred to as a CKB, hereinafter) and a start pulse (referred to as an SP, hereinafter) are inputted to the shift register. FIG. 1B illustrates a detailed circuit structure of the block 100. In FIG. 1B, a block 110 is a first amplitude compensation circuit and a block 120 is a second amplitude compensation circuit. FIG. 1C illustrates a further detailed circuit structure. In FIG. 1C, the first amplitude compensation circuit 110 comprises a TFT 101 connected to power supply VDD and a TFT 102 connected to power supply VSS, while the second amplitude compensation circuit 120 comprises a TFT 103 connected to the power supply VDD and a TFT 104 connected to the power supply VSS.

An operation of the circuit will be described with reference to the circuit diagram shown in FIGS. 1A through 1C and a timing chart shown in FIG. 2. An output pulse at an $(m-1)^{th}$ stage is inputted (an SP is inputted at m=1, that is, at the first stage) to gate electrodes of the TFTs 101 and 104 in a pulse output circuit at a certain $m^{th}$ stage (1<m≤n). Then, the level reaches H, so that the TFTs 101 and 104 turn ON (refer to 201 shown in FIG. 2). Potential of a node á is thereby raised up toward the VDD side (refer to 202 shown in FIG. 2), and the TFT 101 turns OFF to be in the floating state when the potential reaches (VDD−VthN). Thus, a TFT 105 turns ON. On the other hand, the TFTs 102 and 103 are OFF since a pulse is not inputted to gate electrodes of the TFTs 102 and 103 at this time and the level is still L. Accordingly, potential of a gate electrode of a TFT 106 is the level L and the TFT 106 is OFF, and thereby, the potential of an output node is raised up toward the VDD side as a CK inputted from an end of an impurity region of the TFT 105, that is, the first input signal line (1) reaches the level H (refer to 203 shown in FIG. 2).

A capacity means 107 is provided between the gate of the TFT 105 and the output node, and additionally, the node á, that is, the gate electrode of the TFT 105 is in the floating state at that moment. Therefore, the potential of the gate electrode of the TFT 105 is further raised from (VDD−VthN) by a bootstrap as the potential of the output node rises. The potential of the gate electrode of the TFT 105 then becomes higher than VDD+VthN (refer to 202 shown in FIG. 2). Thus, the potential of the output node rises completely to VDD without being reduced due to a threshold of the TFT 105 (refer to 203 shown in FIG. 2).

Figure 2:
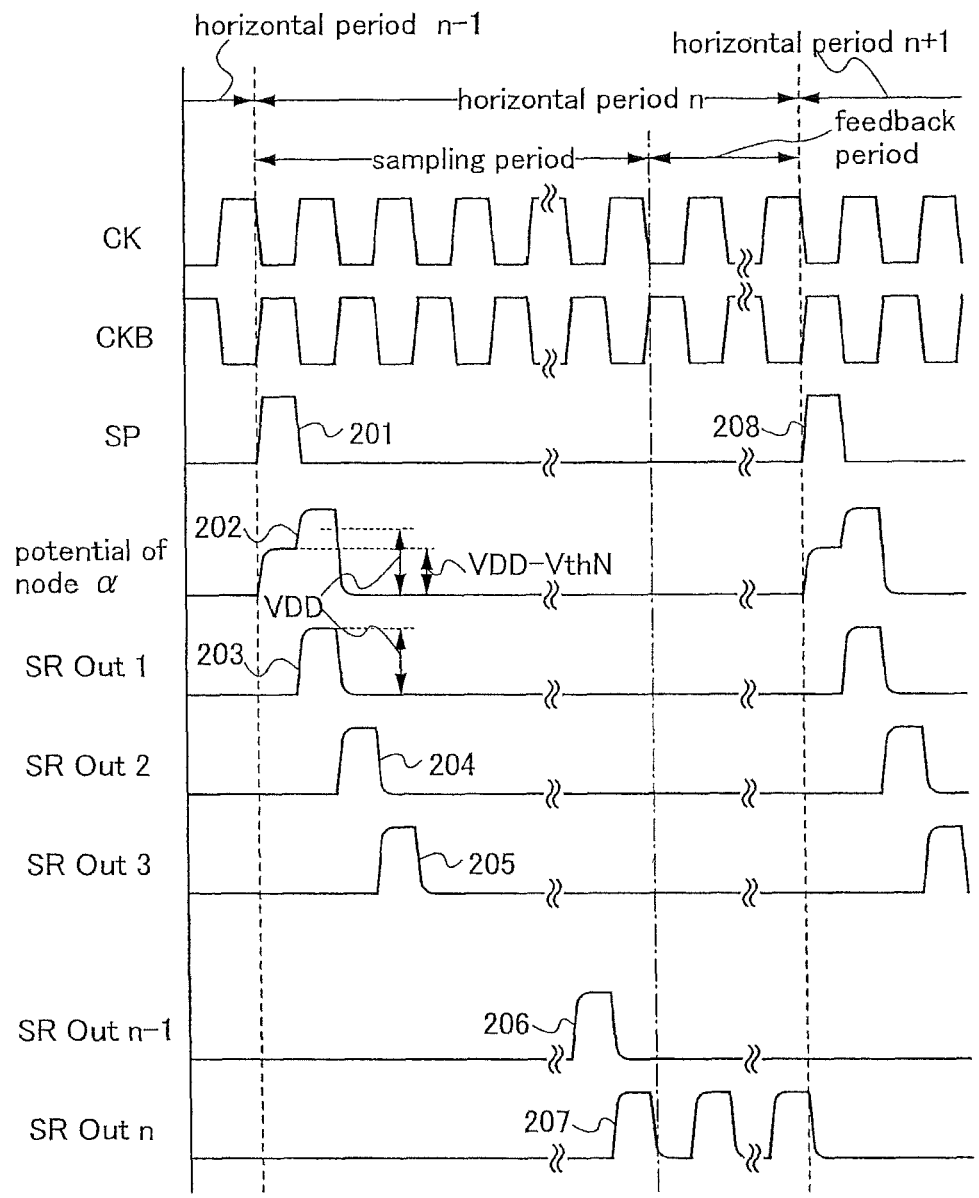
FIG. 2 is a timing chart for driving the pulse output circuit shown in FIGS. 1A through 1C.

Similarly, a pulse is outputted in accordance with a CKB at the $(m+1)^{th}$ stage (refer to 204 shown in FIG. 2). The output pulse at the $(m+1)^{th}$ stage is fed back to the $m^{th}$ stage to be inputted to the gate electrodes of the TFTs 102 and 103. When the gate electrodes of the TFTs 102 and 103 reach the level H and the TFTs 102 and 103 turn ON, the potential of the node á is reduced toward the VSS side so that the TFT 105 turns OFF. Simultaneously, the potential of the gate electrode of the TFT 106 reaches the level H and the TFT 106 turns ON so that the potential of the output node at the $m^{th}$ stage reaches the level L.

After the above, similar operations are repeated to the final stage, so that a pulse having VDD−VSS amplitude would be outputted in due course. At the final stage, a CK is kept to be outputted as it is since there is no output pulse at the subsequent stage, which is to be inputted from a third input signal line shown in FIG. 1C. Accordingly, the number of stages of the shift register can be provided more than n so that surplus stages including the final stage can be treated as dummy stages, when the number of the output stages of a practically necessary sampling pulse is n, since the output at the final stage cannot be used as a sampling pulse. The output of the final stage should be stopped in any manner before a subsequent horizontal period starts. In the circuit shown in FIGS. 1A through 1C, a start pulse inputted to the first stage is also inputted to the third input signal line at the final stage to be used as a feedback pulse, and thereby, the pulse output at the final stage is stopped just before the subsequent horizontal period starts.

The structure of an amplitude compensation circuit shown as the present embodiment mode is only an example and other structures may be used.

Figure 14A:
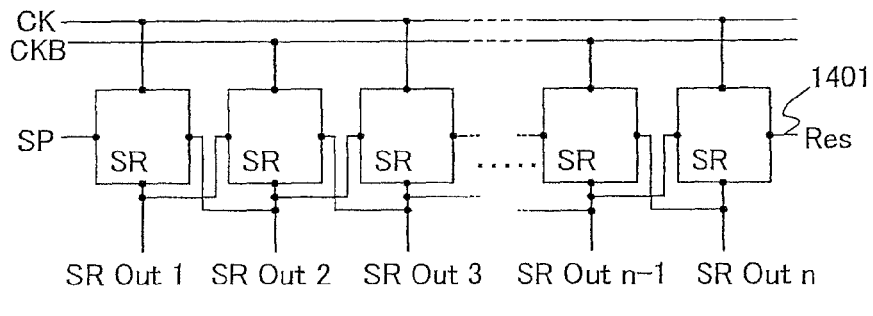
FIGS. 14A and 14B illustrate a shift register to which an input of a reset signal is added and its timing chart.
Figure 14B:
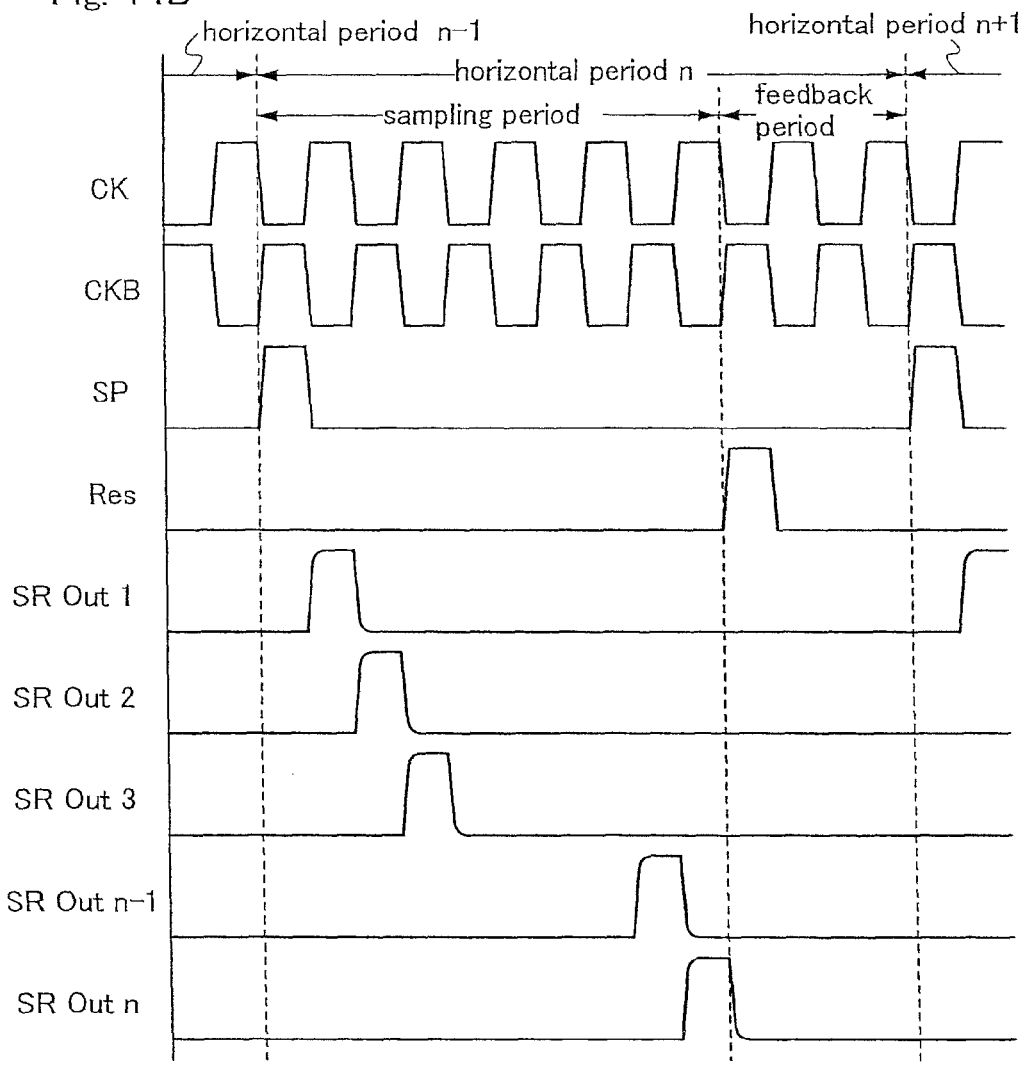
Figure 15A:
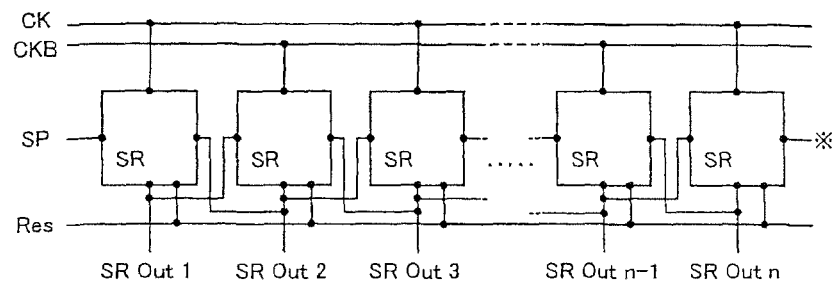
FIGS. 15A and 15B illustrate a shift register to which an input of a reset signal is added.
Figure 15B:
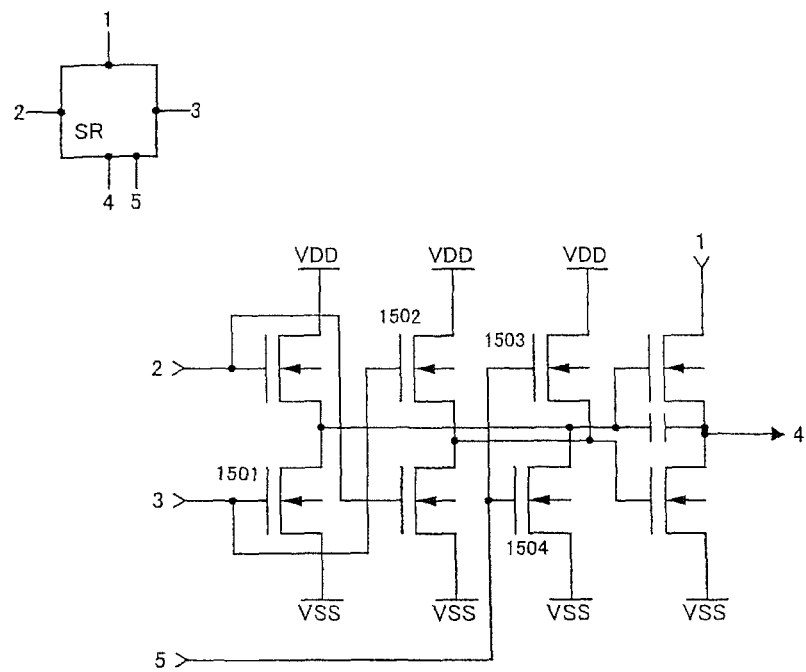

There are other methods such that a reset signal is provided to be inputted to a third input signal line 1401 at the final stage during a feedback period so as to stop a pulse output as shown in FIGS. 14A and 14B and that TFTs 1503 and 1504 for resetting are provided so that, when the reset signal is inputted, potential of a gate electrode of a TFT 1505 reaches the level L and the TFT 1505 turns OFF as well as potential of a gate electrode of a TFT 1506 reaches the level H and the TFT 1506 turns ON in order to fix outputs at all stages at the level L, as shown in FIGS. 15A and 15B. The timing for inputting a reset signal can be same as that of the timing chart shown in FIG. 14B. In FIG. 15A, the third input signal line shown by a mark * in the pulse output circuit at the final stage is preferably connected to power potential on the VSS side so that the TFTs 1501 and 1502 would be always OFF.

Moreover, in the case of a circuit shown in FIGS. 15A and 15B, potentials of the output node at all stages can be determined (the output node at all stages can be determined to be at the level L in the case of the circuit shown in FIGS. 15A and 15B) by first inputting a reset signal before the circuit starts output of a sampling pulse, that is, just after the power supply turns on, although it is not especially shown in drawings. Such operation is effective for a stable operation of a circuit in the case of a dynamic circuit.

Due to the operation described above, even in a circuit comprising single conductive TFTs, an output signal having normal amplitude with respect to an input signal can be obtained without amplitude attenuation caused by influence of a threshold of a TFT connected to the power supply on the high potential side. It is also a large advantage that a structure of the circuit shown in the present embodiment mode is not much complicated comparing with a conventional CMOS circuit.

Embodiment Mode 2

Figure 3A:
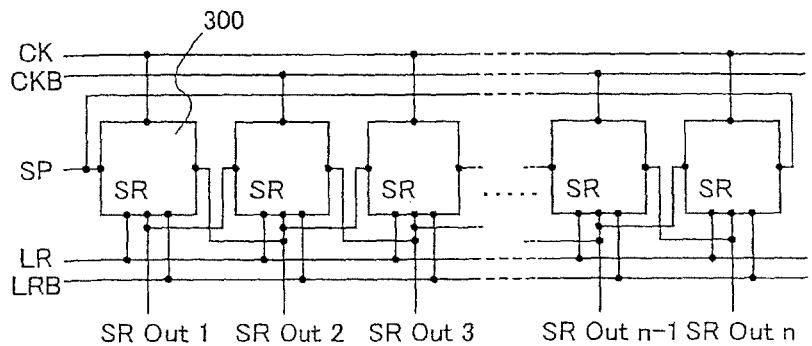
FIGS. 3A and 3B illustrate a shift register adding with a scan direction switch function, which is one embodiment mode of a pulse output circuit according to the invention.
Figure 3B:
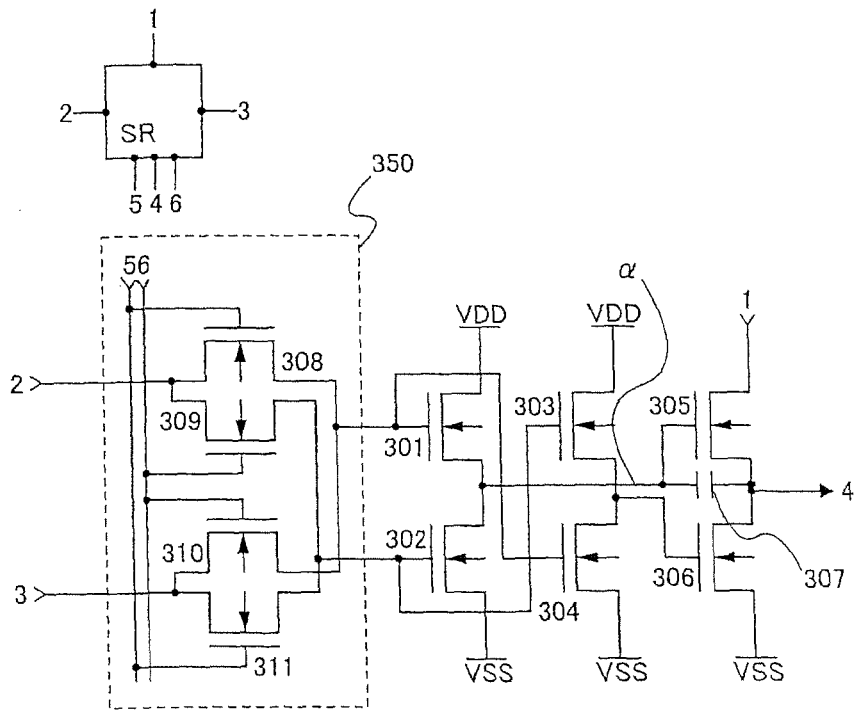

FIGS. 3A and 3B illustrate an example that a shift register shown in the present embodiment mode of the invention is added with a scan direction reverse function. In FIG. 3A, a scan direction switch signal (LR) and a scan direction switch back signal (LRB) are added thereto comparing with the circuit shown in FIG. 1A.

FIG. 3B illustrates a detailed structure of one stage of a pulse output circuit shown by a block 300 in FIG. 3A. A body of the pulse output circuit comprising TFTs 301 to 306 and a capacity means 307 is same as that of FIG. 1B, while a scan direction switch circuit shown by a dotted line frame 350 is provided between the second and third input signal lines (2) and (3) and the body of the pulse output circuit. The scan direction switch circuit in this embodiment mode comprises TFTs 308 to 311 and functions as an analog switch.

Gate electrodes of the TFTs 301 and 304 are connected to the second input signal line (2) through the TFT 308 and to the third input signal line (3) through the TFT 310, as shown in FIG. 3B. Gate electrodes of the TFTs 302 and 303 are connected to the second input signal line (2) through the TFT 309 and to the third input signal line (3) through the TFT 311. An LR signal is inputted to gate electrodes of the TFTs 308 and 310, while an LRB signal is inputted to gate electrodes of the TFTs 309 and 311. The LR and LRB are exclusively at the level H or L, and thus, the scan direction switch circuit in this embodiment is at the following two conditions.

First, the TFTs 308 and 310 turn ON when the LR is at the level H and the LRB is at the level L, the second input signal line (2) conducts to the gate electrodes of the TFTs 301 and 304 and the third input signal line (3) conducts to the gate electrodes of the TFTs 302 and 303. Second, the TFTs 309 and 311 turn ON when the LR is at the level L and the LRB is at the level H, the second input signal line (2) conducts to the gate electrodes of the TFTs 302 and 303, and the third input signal line (3) conducts to the gate electrodes of the TFTs 301 and 304.

That is, a sampling pulse is outputted in order of first stage, second stage, . . . and the final stage when the LR reaches the level H by a signal inputted thereto while the LRB is at the level L, and to the contrary, the sampling pulse is outputted in order of the final stage, . . . , the second stage and the first stage when the LR is at the level L while the LRB reaches the level H by a signal inputted thereto. According to the invention, such functions can be easily added by additionally providing a simple circuit. In this embodiment, however, a circuit comprises the N-channel type of TFTs. In the case of using the P-channel type of TFTs to form a circuit, a condition that a signal is inputted to the LR means a condition that the LR signal reaches the level L, and a condition that the LR signal is at the level H means a condition that the signal is not inputted thereto.

The scan direction switch circuit in this embodiment is just an example. Similar functions may be added in another structure.

EMBODIMENTS

Embodiments of the invention will be described hereinafter.

Embodiment 1

An example of producing a display device by means of single conductive TFTs is described in this embodiment.

The substrate having the pixel TFT and the driver circuit may be manufactured in accordance with a known method, for example, as disclosed in U.S. Pat. No. 5,889,291 issued to Koyama et al. Also, it is possible to crystallize a semiconductor film for an active layer of the TFTs by utilizing a metal element for promoting crystallization although other known methods can be used for crystallization. Such a method of using the metal element is disclosed, for example, in U.S. Pat. No. 5,643,826 issued to Ohtani et al. The entire disclosures of these U.S. Pat. Nos. 5,889,291 and 5,643,826 are incorporated herein by reference.

Figure 12:
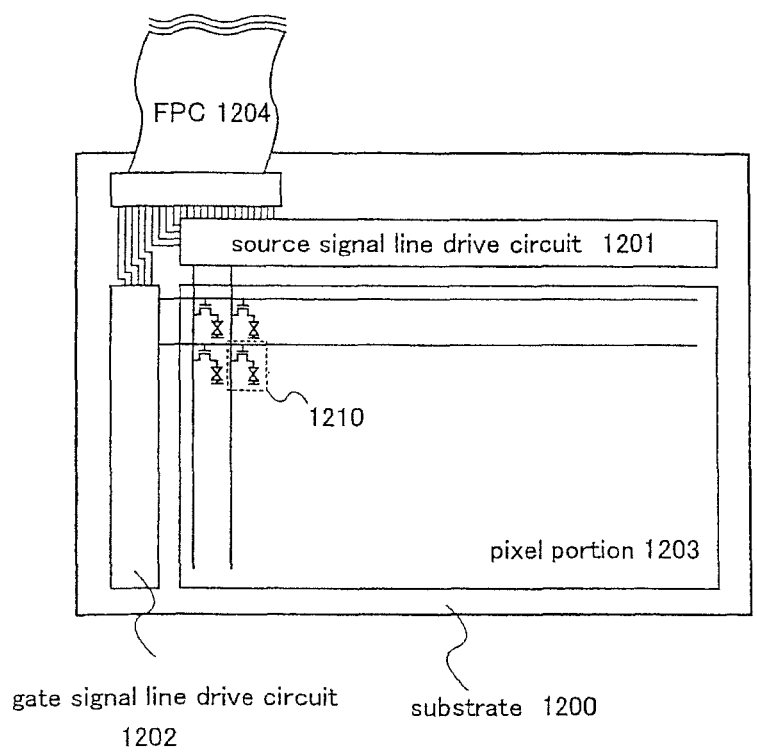
FIG. 12 illustrates a whole outlook of a display device provided in accordance with the invention.

FIG. 12 is a schematic view of a display device. A source signal line drive circuit 1201, a gate signal line drive circuit 1202 and a pixel portion 1203 are integrated into one on a substrate 1200 to form a display device. A part enclosed by a dotted line frame 1210 in the pixel portion corresponds to one pixel. In an example shown in FIG. 12, the pixel of a liquid crystal display device is shown and controls electric charges applied to one electrode of a liquid crystal element by means of one TFT (referred to as a pixel TFT, hereinafter). Signals to the source signal line drive circuit 1201 and a gate signal line drive circuit 1202 are inputted from the outside through a flexible print circuit (FPC) 1204.

Figure 4:
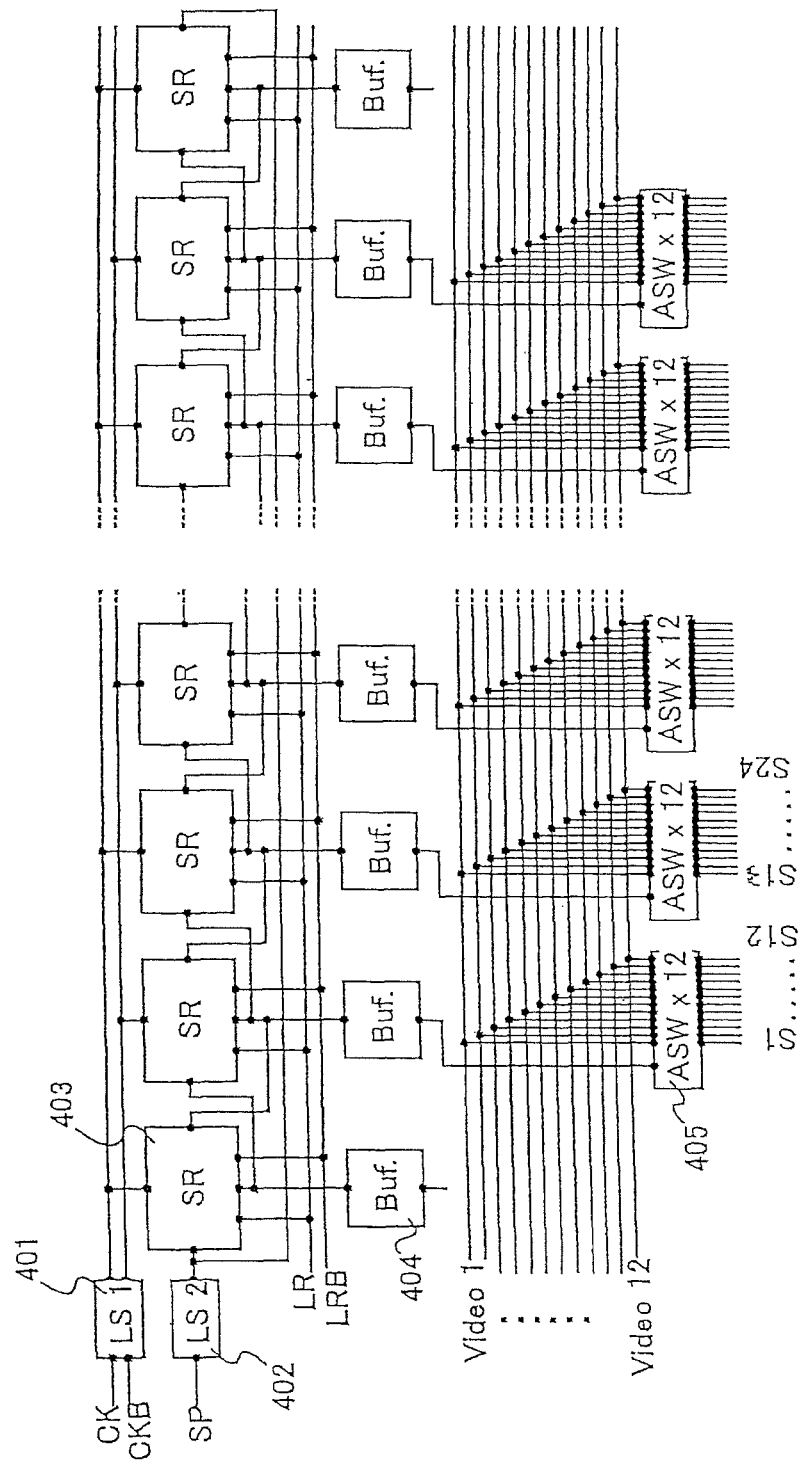
FIG. 4 illustrates an example of a structure of a source signal line drive circuit in a display device provided in accordance with the invention.

FIG. 4 illustrates a whole structure of the source signal line drive circuit 1201 in the display device shown in FIG. 12. This source signal line drive circuit includes a level shifter for a clock signal 401, a level shifter for a start pulse 402, a scan direction switch type of shift register 403, a buffer 404 and a sampling switch 405. The signals from the outside are a clock signal (CK), a clock reverse signal (CKB), a start pulse (SP), a scan direction switch signal (LR, LRB) and analog image signals (Video 1 to Video 12). The CK, CKB and SP in the above are amplitude-converted by a level shifter just after inputted from the outside as signals of low voltage amplitude, and then, inputted to a drive circuit as signals of high voltage amplitude. A sampling pulse outputted from a shift register at a stage carries out simultaneous sampling of analog image signals for 12 columns of source signal lines by driving the sampling switch 405.

Figure 5A:
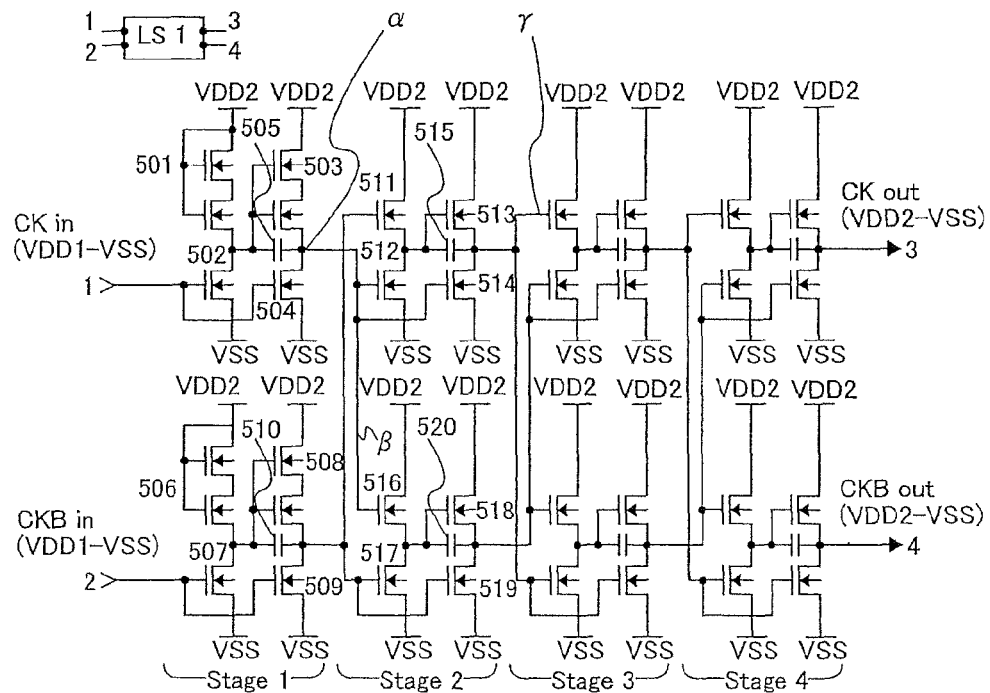
FIGS. 5A through 5D illustrate in detail a circuit structure of a level shifter in a display device provided in accordance with the invention and views of its amplitude.

FIG. 5A illustrates a structure of a level shifter for a clock signal (LS 1). In this structure, it is arranged that a single input type of level shifter circuits are disposed in parallel (Stage 1) while respective outputs corresponding to two inputs at buffer stages (Stage 2 to Stage 4) are alternately inputted.

An operation of a circuit will be now described. There are three kinds of potential VDD 1, VDD 2 and VSS, in which VSS<VDD 1<VDD 2, as the potential of power supply used in FIGS. 5A through 5C. In this embodiment, VSS=0 [v], VDD 1=5 [v] and VDD 2=16 [v]. TFTs shown by 501, 503, 506 and 508 in FIG. 5A may be in a single gate structure or in a multiple gate structure in which there are three or more gate electrodes, although they are in a double gate structure in this embodiment. Other TFTs are also not limited by the number of gate electrode.

A CK having VDD 1–VSS amplitude is inputted from a signal input portion 1 (1). TFTs 502 and 504 turn ON when the CK is at the level H, while the TFT 503 turns OFF when potential of a gate electrode of the TFT 503 reaches the level L. Thus, a signal at the level L is outputted to an output node á. The TFTs 502 and 504 turn OFF when the CK is at the level L. Accordingly, potential of the gate electrode of the TFT 503 is raised up toward the VDD 2 side through the TFT 501 operating in saturation and the TFT 501 turns OFF when the potential reaches VDD 2–VthN so that the gate electrode of the TFT 503 is in the floating state. The TFT 503 thereby turns ON and the potential of the output node á is raised up toward the VDD 2 side. The potential of the gate electrode of the TFT 503, which is in the floating state, is raised up due to an operation of a capacity means 505 as the potential of the output node á rises. The raised potential of the gate electrode of the TFT 503 is higher than VDD 2, and when it is also higher than VDD+VthN, the level H of the output node á becomes equal to VDD 2. Thus, the level L of the output signal becomes VSS and the level H becomes VDD 2, which completes amplitude conversion.

On the other hand, a CKB having VDD 1–VSS amplitude similarly to the CK is inputted from a signal input portion 2 (2). A level shifter comprising TFTs 506 to 509 and a capacity means 510 converts amplitude, while a signal having VDD 2–VSS amplitude is outputted to an output node â. Signals outputted to the nodes á and â have contrary polarities to the inputted CK and CKB.

In a level shifter used in the display device of this embodiment, buffer stages (Stage 2 to Stage 4) are provided in view of load to a pulse after amplitude conversion. An inverter circuit forming the buffer stages is of a two input type and requires an input signal and its reverse signal. In a buffer circuit shown by Stage 2 in FIG. 5, a signal inputted to a gate electrode of a TFT 511 has an opposite polarity to a signal inputted to a gate electrode of a TFT 512. That is the case for TFTs 516 and 517. The aforementioned level shifter output is here used as a reverse input of each other's signals since the CK and the CKB are each other's polarity reverse signals.

An operation of an inverter circuit forming a buffer stage will be now described. An operation of an inverter circuit comprising the TFTs 511 to 514 and a capacity means 515 will be only described hereinafter in detail. Operations of other inverter circuits are similar to the above.

The TFT 511 turns ON and potential of a gate electrode of the TFT 513 is raised up towards the VDD 2 side when a signal inputted to the gate electrode of the TFT 511 is at the level H. Then, when the potential of a gate electrode of the TFT 513 reaches VDD 2–VthN, the TFT 511 turns OFF and the gate electrode of the TFT 513 is in the floating state. On the other hand, the TFTs 512 and 514 turn OFF when signals at the level L are inputted to gate electrodes thereof. Following to this, the TFT 513 turns ON and potential of an output node ā is raised up toward the VDD 2 side. The potential of the gate electrode of the TFT 513, which is in the floating state, is raised up to higher potential than VDD 2+VthN due to an operation of a capacity means 515 as well as the aforementioned shift register and the level shifter. Thus, the level H of the output node ā becomes equal to VDD 2.

On the other hand, the TFT 511 turns OFF when a signal inputted to the gate electrode of the TFT 511 is at the level L, while the TFTs 512 and 514 turn ON when signals at the level H are inputted to the gate electrodes of the TFTs 512 and 514. Thus, the potential of the gate electrode of the TFT 513 reaches the level L and the potential of the output node ā reaches the level L.

An operation of an inverter circuit comprising TFTs 516 to 519 and a capacity means 520 is similar to the above, and a pulse is outputted to output node ä. The pulse outputted to the output node ä has a reverse polarity to a signal outputted to the output node ā.

Following to the above, pulses are also outputted finally from a signal output portion 3 (3) and a signal output portion 4 (4) in accordance with the similar operation in Stage 3 and Stage 4. In FIG. 5A, the output from Stage 2 is inputted to Stage 3 so that the logic would not be reversed, on the contrary to the case of the input from Stage 1 to Stage 2. There is no special limitation, however, in connecting stages so long as the stages can be finally connected in accordance with logic of a pulse necessary for a user.

Figure 5B:
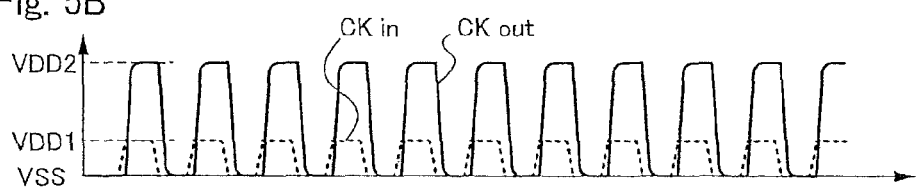

FIG. 5B illustrates amplitude conversion of a clock signal (CK). Amplitude of an input signal is from 0 to 5 [V], while amplitude of an output signal is from 0 to 16 [V].

Figure 5C:
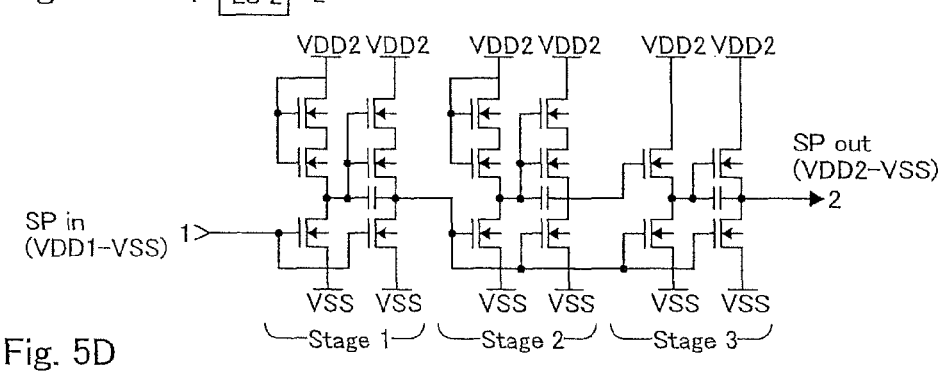

FIG. 5C illustrates a level shifter for a start pulse (LS 2). In FIG. 5C, by using a single input type of level sifter circuit (Stage 1), Stage 1 is followed by a single input type of inverter circuit (Stage 2) and a two input type of inverter circuit (Stage 3) since the start pulse has no reverse signal. A circuit operation is similar to that of the level shifter for a clock signal, and therefore, omitted here from description.

Figure 5D:

FIG. 5D illustrates amplitude conversion of a start pulse (SP). Amplitude of an input signal is 5 [V], while amplitude of an output signal is 16 [V].

Figure 6A:
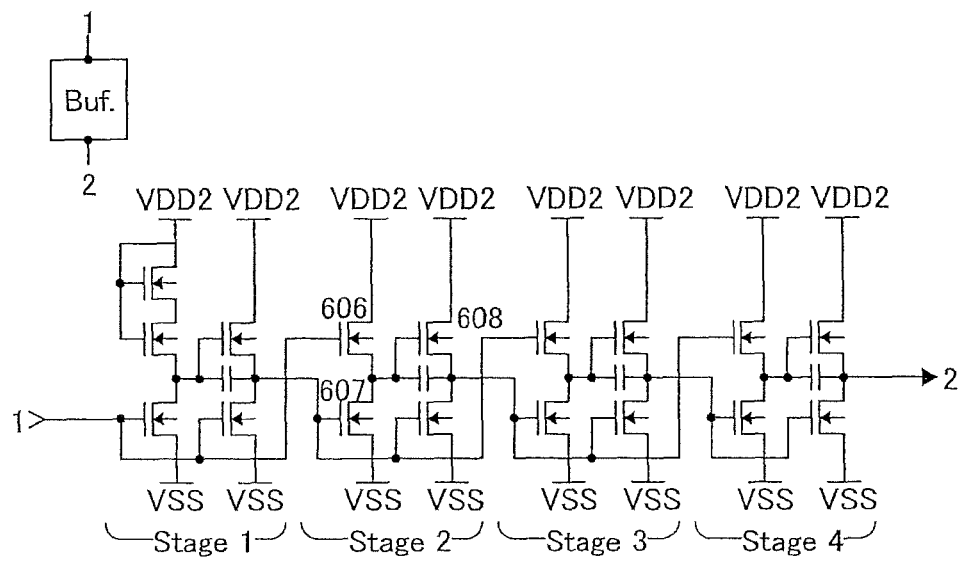
FIGS. 6A and 6B illustrate in detail a circuit structure of a buffer and a sampling switch in a display device provided in accordance with the invention.

FIG. 6A illustrates a structure of a buffer (Buf.) comprising a single input type of inverter circuit (Stage 1) and three stages of two input type of inverter circuit (Stage 2 to Stage 4). An operation of a single input type of inverter circuit is same as that of the level shifter circuit except that amplitude of a pulse inputted is VDD 2–VSS and that there is no amplitude conversion between input and output pulses.

An operation of the two input type of inverter circuit is such that an output signal from a preceding stage is inputted as an input signal to a TFT 607 while an input signal to the inverter at a preceding stage is inputted to a TFT 606 as a reverse signal to an input signal. Excluded operations of the TFT 606 and the TFT 607 enable potential of a gate electrode of a TFT 608 to be controlled as well as the aforementioned level shifter circuit. In operations of the subsequent inverter circuits, an output signal from a preceding stage is used as an input signal and an input signal to a preceding stage is used as a reverse signal to the input signal.

Figure 6B:
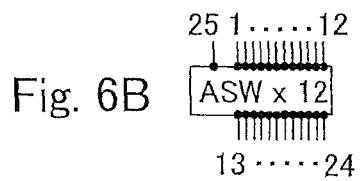
Figure 6B:
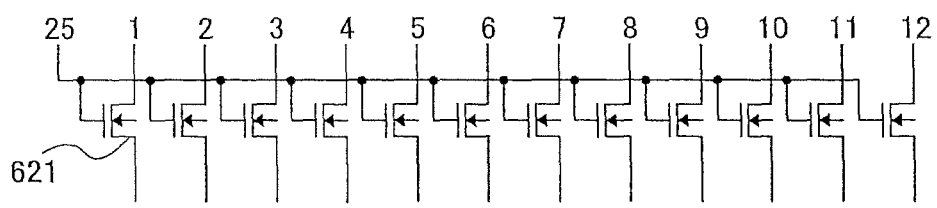

FIG. 6B illustrates a structure of a sampling switch. A sampling pulse is inputted from a signal input portion 25 (25) so that twelve TFTs 621 provided in parallel would be simultaneously controlled. An analog image signal is inputted from signal input portions 1 (1) to 12 (12) and the image signal is written in a source signal line when a sampling pulse is inputted.

An inverter circuit and a level shifter among circuits forming a drive circuit shown in this embodiment are same as those described in an invention filed as the Patent Application No. 2001-133431 by the same inventors.

In a display device shown in this embodiment, TFTs constituting a circuit of a whole display device including pixel portions are produced only by single conductive TFTs whose conductive type is same as that of the pixel TFTs (an N type of TFT, for example). Accordingly, it is possible to omit an ion-doping process for adding a P type of TFT to a semiconductor layer, which can contribute to reduce in a manufacturing cost and to improvement in a yield.

It would be possible, of course, according to the invention to produce a drive circuit and a pixel TFT only by means of the P type of TFTs although the N type of conductive TFTs are used to form a display device in this embodiment. In this case, it should be noted that an ion-doping process to be omitted is a process to add an N type of TFT to a semiconductor layer. Furthermore, the invention can be applied not only to a liquid crystal display device but also any devices so long as the devices are produced by integrally forming a drive circuit on an insulating material.

Embodiment 2

An example of a simplified structure of the pulse output circuit shown in FIGS. 1A through 1C in the embodiment mode will be described in this embodiment.

Figure 7A:
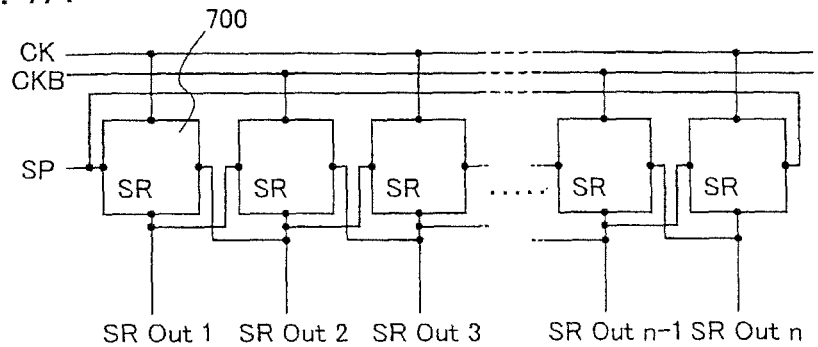
FIGS. 7A through 7C illustrate a shift register, which is an embodiment of the invention and whose structure is simplified.
Figure 7B:
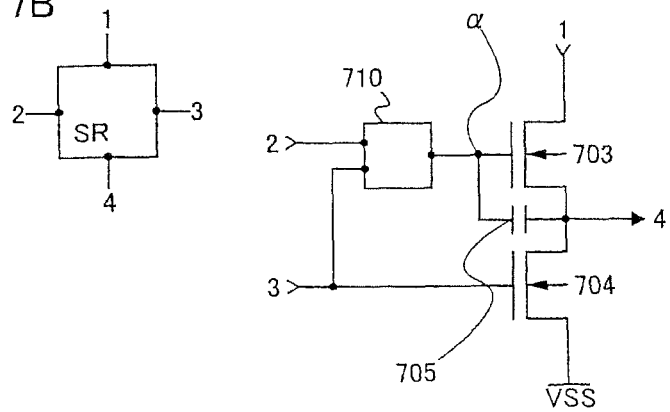
Figure 7C:
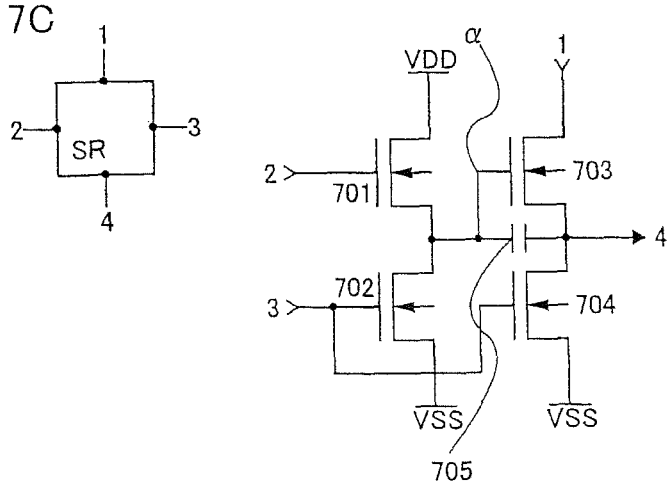

FIGS. 7A through 7C illustrate a shift register of this embodiment. In FIG. 7A, a block 700 is a pulse output circuit for outputting a stage of pulses. The shift register in FIG. 7A comprises n steps of pulse output circuits. FIG. 7B illustrates a detailed circuit structure. A block diagram of the shift register shown in FIG. 1A is same as that of the shift register shown in FIG. 7A and a signal to be inputted is also same in the both cases. This embodiment is different in that a pulse output circuit comprises four TFTs 701 to 704 and a capacity means 705 as shown in FIG. 7C. In FIG. 7B, a block 710 is an amplitude compensation circuit. FIG. 7C illustrated a further detail. In FIG. 7C, the amplitude compensation circuit comprises the TFT 701 connected to the power supply VDD and the TFT 702 connected to the power supply VSS.

An operation of the circuit will be now described. A pulse outputted from an $(m-1)^{th}$ stage is inputted to a gate electrode of the TFT 701 at an $m^{th}$ stage (1<m≤n) (an SP is inputted when m=1, that is, at the first stage), potential of the gate electrode of the TFT 701 reaches the level H, and the TFT 701 turns ON. Thereby, potential of the node á is raised up toward the VDD side. Then, when the potential of the node á reaches VDD−VthN, the TFT 701 turns OFF and the node á is in the floating state so that the TFT 703 would turn ON. On the other hand, the TFTs 702 and 704 are OFF since no pulse is yet inputted at that time in gate electrodes of the TFTs 702 and 704 and the level is kept to be L. Thus, potential of an output node is raised up toward the VDD side as a CK inputted from an end of an impurity region of the TFT 703, that is, from a first input signal line (1), reaches the level H.

A capacity means 705 is provided between a gate electrode of the TFT 703 and the output node, and the node á, that is, a gate electrode of the TFT 703 is in the floating state. Accordingly, potential of the gate electrode of the TFT 703 is further raised from VDD−VthN in a bootstrap manner as potential of the output node rises. The potential of the gate electrode of the TFT 703 then becomes higher than VDD+VthN, and thereby, the potential of the output node rises up completely to VDD without decreasing due to the threshold of the TFT 703.

Similarly, a pulse is outputted at the $(m+1)^{th}$ stage in accordance with a CKB. The output pulse at the $(m+1)^{th}$ stage is fed back to the $m^{th}$ stage to be inputted to the gate electrodes of the TFTs 702 and 704. Potential of the node á is reduced toward the VSS side and the TFT 703 turns OFF when the gate electrodes of the TFTs 702 and 704 reach the level H to turn ON the TFTs 702 and 704, and then, the potential of the output node reaches the level L.

Similar operations are repeated to the final stage after the above, and a pulse having amplitude VDD-VSS is outputted in due course. At the final stage, a CK is continuously outputted as it is since there is no output pulse at the subsequence stage, which is to be inputted from a third input signal line (3) shown in FIG. 7B. It is not a problem, however, to assume a dummy stage as well as in the embodiment. In this embodiment shown in FIGS. 7A through 7C, an output pulse at the final stage is stopped just before a subsequent horizontal period by inputting a start pulse to the third input signal line at the final stage. In methods other than the above, a reset signal is provided to be inputted to the third input signal line at the final stage during a feedback period in order to stop the pulse output, as described in paragraphs of the embodiment modes, or a reset signal is inputted so that the output nodes at the all stages would be fixed at the level L during the feedback period (as same as FIG. 15).

It is possible to say that the pulse output circuit shown in this embodiment is suitable for a portion in which an output node is not required to hold a desirable potential for a long time, that is, a portion in which a drive frequency is comparatively high. It is because that the number of elements is few compared with the pulse output circuit shown in the embodiment modes and the portions in the floating state are many during a period in which there is no input/output of a sampling pulse. Therefore, the pulse output circuit of this embodiment is preferably used for a source signal line drive circuit in a display device.

Embodiment 3

Figure 13A:
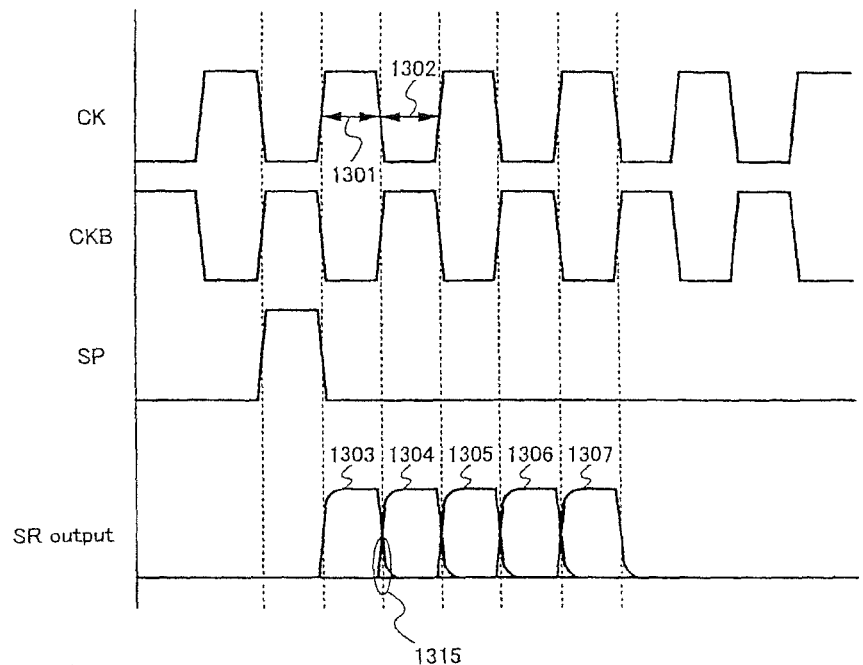
FIGS. 13A through 13C illustrate operations of a shift register shown as an embodiment mode of the invention according to different pulse width of a clock signal.

Refer to FIG. 13 now. In the shift register shown in the embodiment modes 1 and 2 and in the embodiment 2 of the invention, a period of the level H 1301 and that of the level L 1302 of a CK are same in length as shown in FIG. 13A, while a pulse having an opposite polarity to the CK is inputted as a CKB. The width of a sampling pulse is here equal to that of pulses of the CK and the CKB, and thus, an output of the sampling pulse is such as shown by 1303 to 1307 in FIG. 13A. 1303 denotes a sampling pulse at the first stage; 1304 denotes a sampling pulse at the second stage; and following to the above, 1305 to 1307 denote sampling pulses at the third to fifth stages.

Input/output signals of the CK and the others have a leading edge in changing from the level L to the level H and a trailing edge in changing from the level H to the level L. This may cause overlap of pulses, which ideally must not appear. The sampling pulses 1303 to 1307 shown in FIG. 13A show that a leading period overlaps a trailing period between adjacent pulses.

Especially in the case of a display device for displaying an image by sampling analog image signals, the image signal sampling is sometimes carried out in wrong timing due to such overlap of the adjacent sampling pulses, which may cause deterioration of display quality.

Figure 13B:
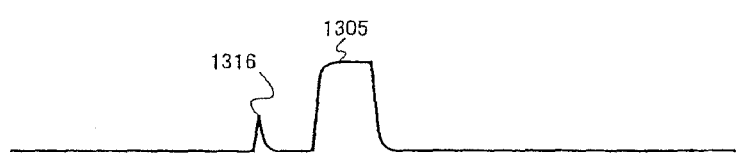
Figure 13C:
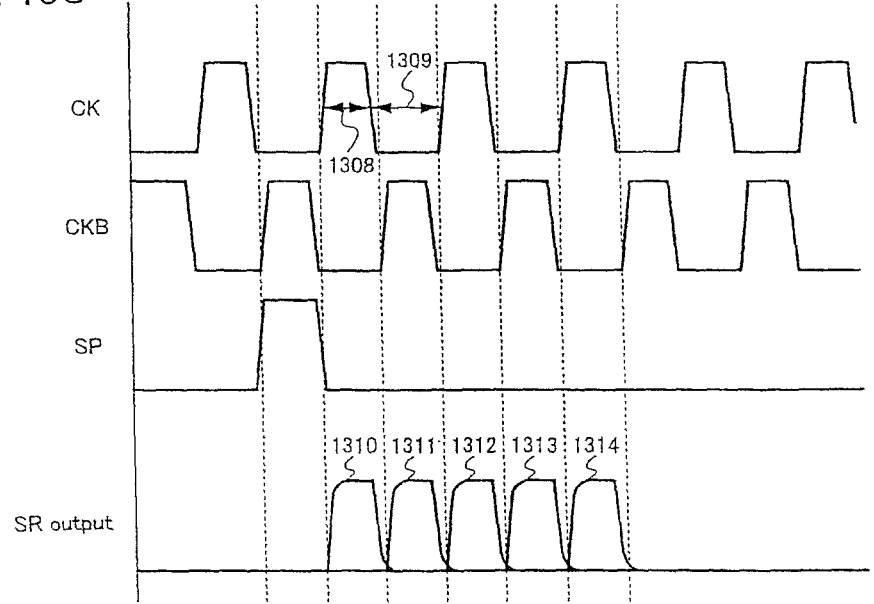

In order to avoid such overlap of the sampling pulses, difference is given in widths of pulses of the CK as shown in FIG. 13C. In this case, a period of the level H 1308 is a little shorter than a period of the level L 1309. A period of the level H is a little shorter than a period of the level L also in the CKB. Such difference solves the overlap of the leading period of the CK and the trailing period of the CKB or the trailing period of the CK and the leading period of the CKB, and thereby, the overlap of the leading and trailing periods between the adjacent sampling pulses can be solved as shown by 1310 to 1314.

FIG. 1B will be now referred to again. In an operation of the pulse output circuit shown in FIG. 1B, a sampling pulse is outputted when a CK or a CKB is outputted to an output node during a period that the TFT 105 is ON. That is, the CK or the CKB is outputted as it is from the time when the potential of the node f starts rising to the time when the potential of the node á is dropped down to the level L by a sampling pulse at a subsequent stage. Thus, when the leading period of the CK overlaps the trailing period of the CKB or when the trailing period of the CK overlaps the leading period of the CKB, wrong pulses sometimes may be outputted before and after the sampling pulse.

The sampling pulse 1304 at a stage preceding the sampling pulse 1305 is inputted to the shift register from which the sampling pulse 1305 is outputted, and from this moment, the CK or the CKB (the CK, in the case of a stage that the sampling pulse 1305 is outputted) appears as it is in the output node, as shown in FIG. 13A. Therefore, a wrong pulse 1316 occurs before the sampling pulse 1305 to be originally outputted as shown in FIG. 13B, when the CK is not completely reduced to the level L at the timing shown by 1315, that is, at the timing that the sampling pulse 1304 at the preceding stage starts leading. Thus, modulating the width of pulses of the CK and the CKB as shown in this embodiment can prevent such wrong operation from occurring.

Embodiment 4

In the examples shown in the embodiment modes and the above embodiments, a circuit comprises only the N-channel type of TFTs. A similar circuit can only comprise the P-channel type of TFTs, however, by interchanging the high potential of the power supply with the low potential thereof.

Figure 16A:
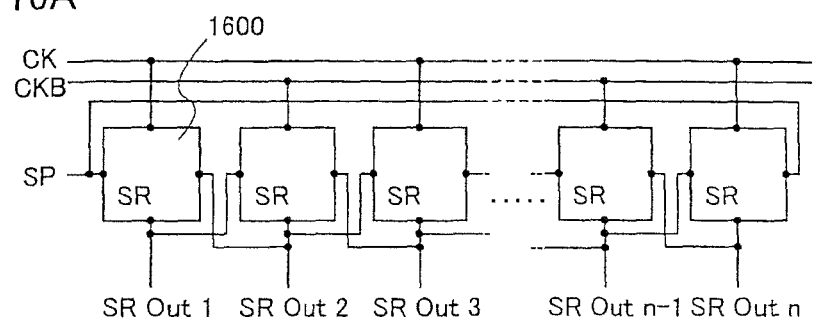
FIGS. 16A and 16B illustrate a circuit structure of a conductive transistor, which is different from an embodiment mode.
Figure 16B:
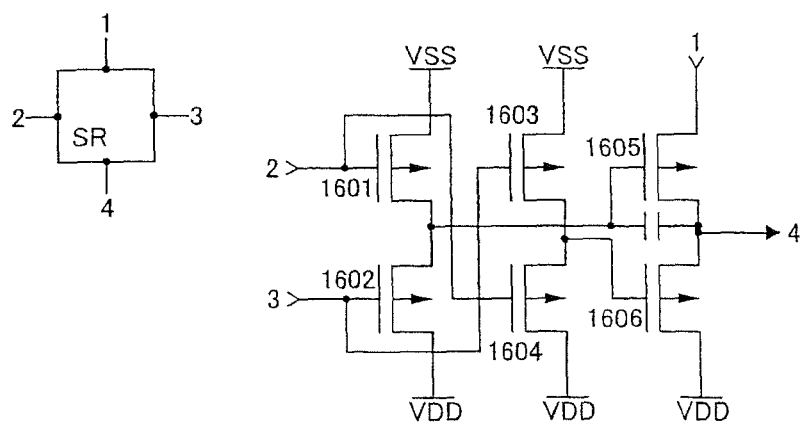

FIGS. 16A and 16B illustrate an example of a shift register only comprising the P-channel type of TFTs. A block diagram shown in FIG. 16A is similar to that of the shift register only comprising the N-channel type of TFTs shown in FIG. 1. In FIG. 16A, a block 1600 is a pulse output circuit for outputting a stage of sampling pulse. A different point from the shift register comprising the N-channel type of TFTs is that the high and low potential of the power supply is contrary as shown in FIG. 16B.

Figure 17:
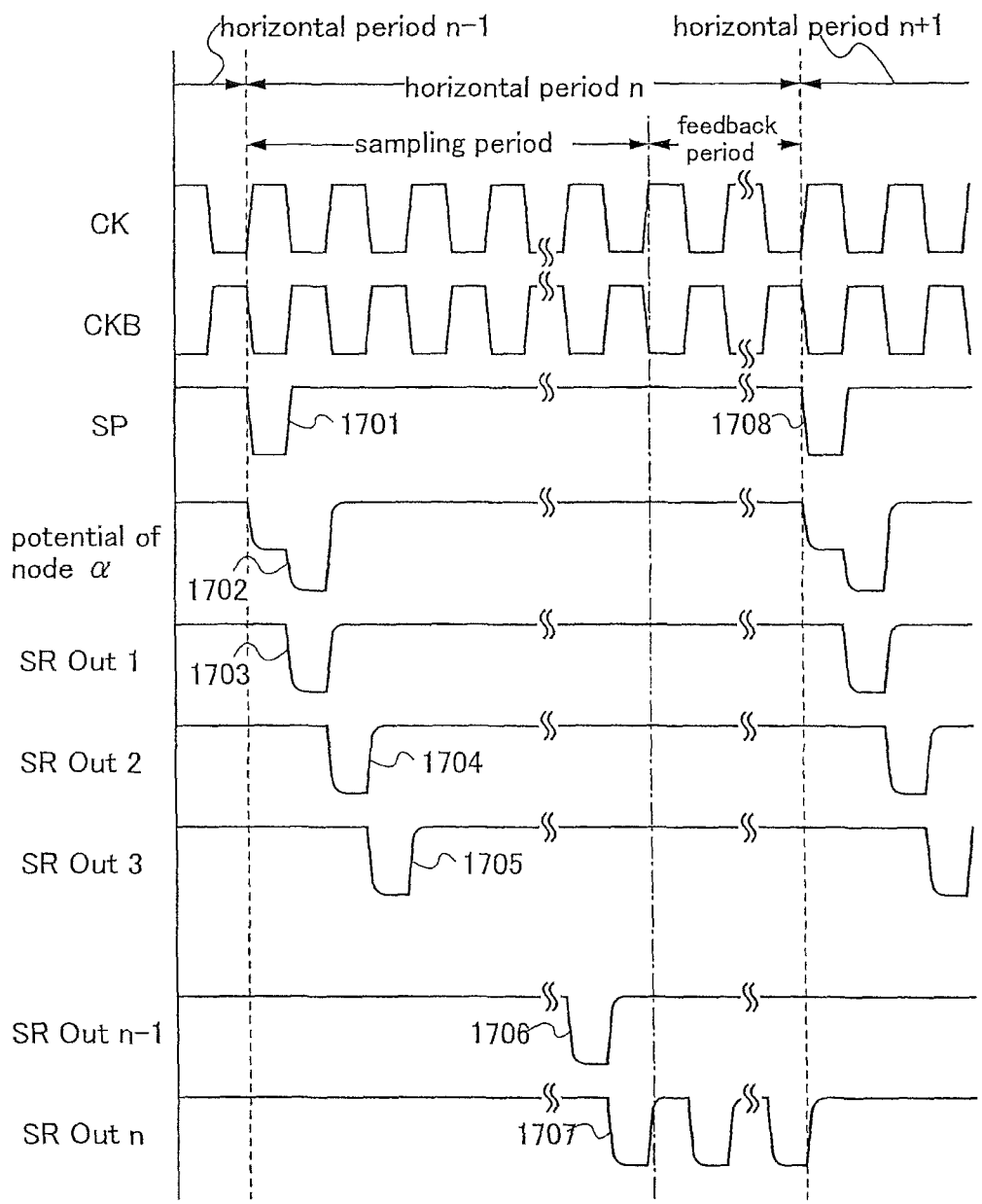
FIG. 17 illustrates a timing chart for driving the shift register shown in FIGS. 16A and 16B.

FIG. 17 illustrates timing charts and output pulses. Operations of respective portions have been described in the embodiment modes with reference to FIGS. 1A through 1C and 2, and therefore, are omitted here from detailed description. The level H and the level L are just contrary to the case shown in FIG. 2.

Embodiment 5

The invention can be applied in manufacturing a display device used for various kinds of electronic apparatus. A portable information terminal (such as electronic note, mobile computer and portable phone), a video camera, a digital camera, a personal computer, a television and a portable phone are considered to be an electronic apparatus described above. Examples thereof are shown in FIGS. 8A through 8G.

Figure 8A:
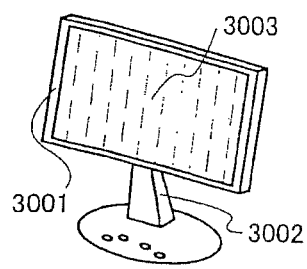
FIGS. 8A through 8G illustrate examples of an electronic apparatus to which the invention can be applied.

FIG. 8A illustrates a liquid crystal display (LCD) comprising a basket body 3001, a holding stand 3002 and a display portion 3003. The invention can be applied to the display portion 3003.

Figure 8B:
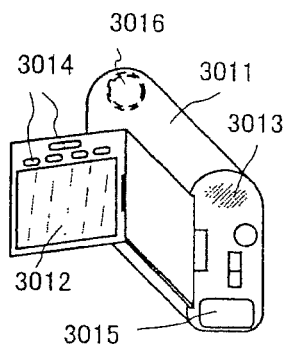

FIG. 8B illustrates a video camera comprising a body 3011, a display portion 3012, a sound input portion 3013, an operation switch 3014, a battery 3015 and an image receiving portion 3016. The invention can be applied to the display portion 3012.

Figure 8C:
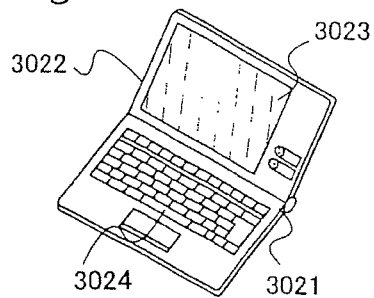

FIG. 8C illustrates a note type of personal computer comprising a body 3021, a basket body 3022, a display portion 3023 and a keyboard 3024. The invention can be applied to the display portion 3023.

Figure 8D:
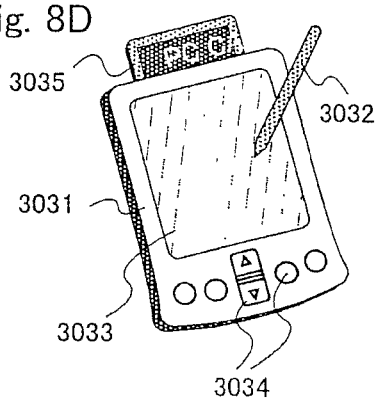

FIG. 8D illustrates a portable information terminal comprising a body 3031, a stylus 3032, a display portion 3033, an operation button 3034 and an external interface 3035. The invention can be applied to the display portion 3033.

Figure 8E:
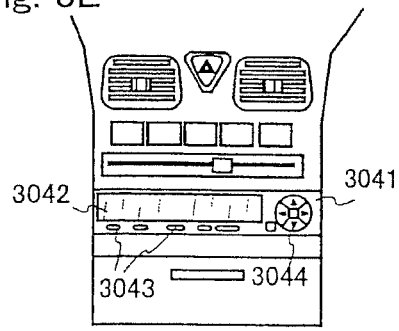

FIG. 8E illustrates an acoustic playback machine, concretely an audio apparatus mounted on an automobile, which comprises a body 3041, a display portion 3042 and operation switches 3043 and 3044. The invention can be applied to the display portion 3042. The invention may be used in a portable or domestic audio machine although an audio apparatus mounted on an automobile is shown as an example in this embodiment.

Figure 8F:
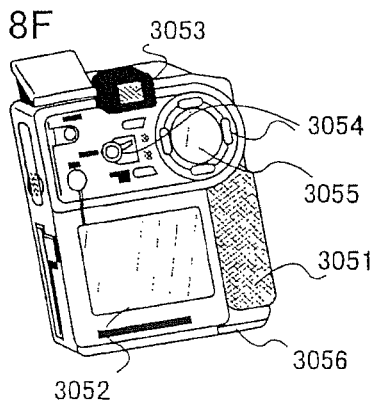

FIG. 8F illustrates a digital camera comprising a body 3051, a display portion (A) 3052, an eyepiece portion 3053, an operation switch 3054, a display portion (B) 3055 and a battery 3056. The invention can be applied to the display portion (A) 3052 and the display portion (B) 3055.

Figure 8G:
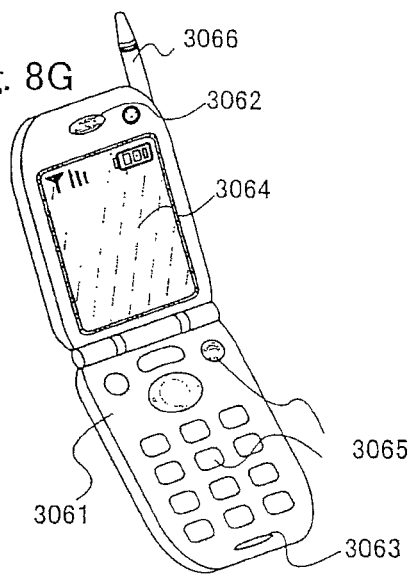
Figure 9A:
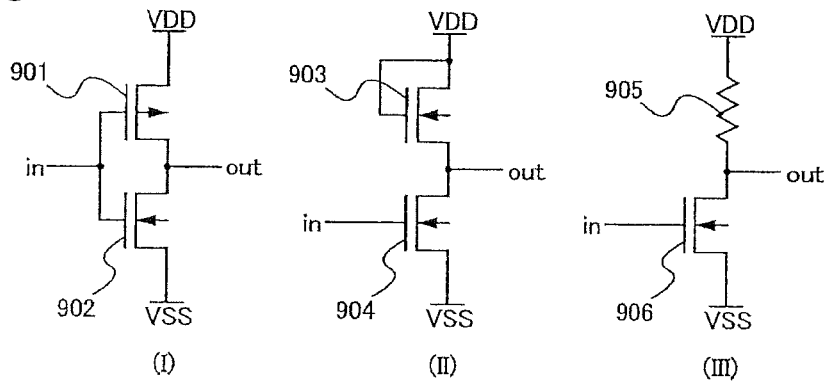
FIG. 9A illustrates structures of a conventional CMOS inverter and a load type inverter and FIG. 9B through 9E illustrate waveforms of respective input and output signals.
Figure 9B:
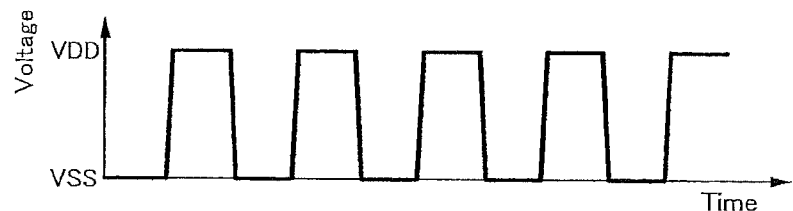
Figure 9C:
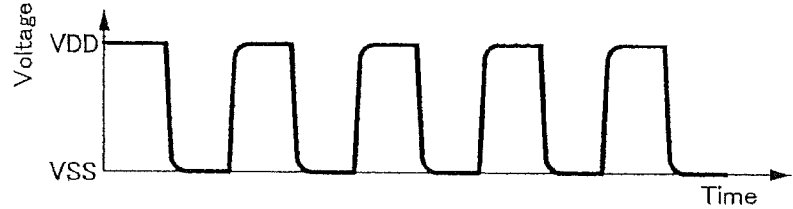
Figure 9D:
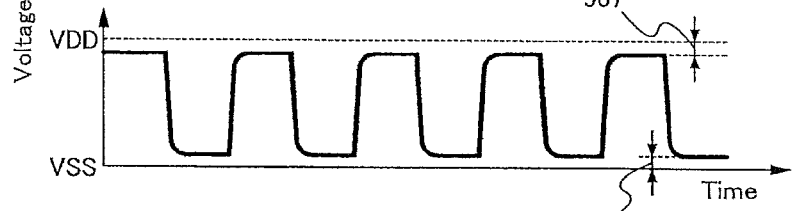
Figure 9E:
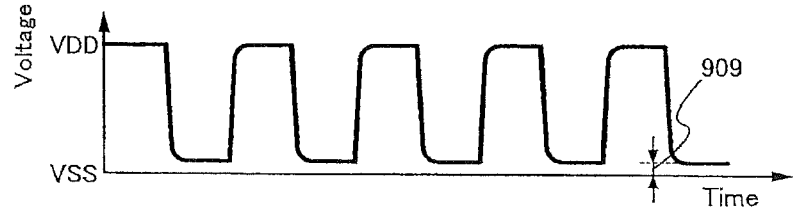
Figure 10A:
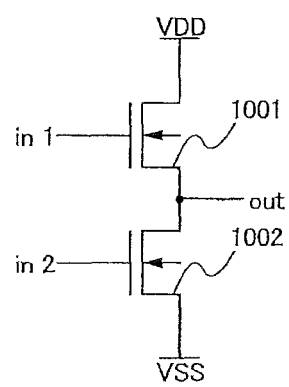
FIGS. 10A and 10B explain an operation principle of a pulse output circuit according to the invention.
Figure 10B:
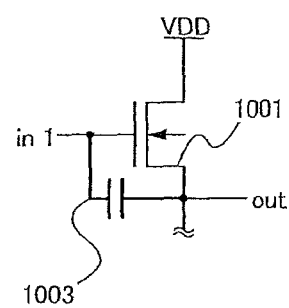
Figure 11A:
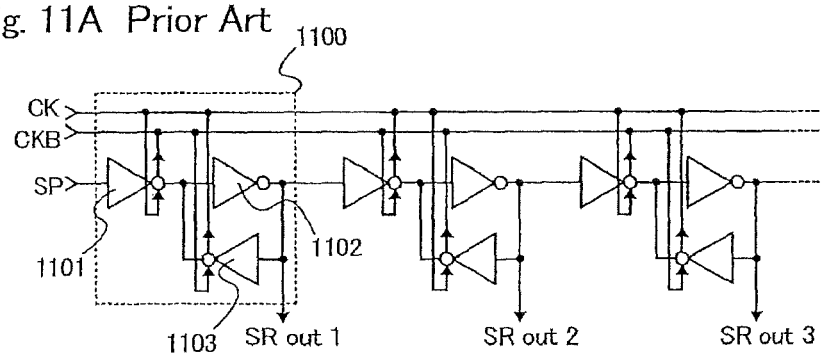
FIGS. 11A through 11C illustrate a circuit structure and a timing chart of a conventional shift register.
Figure 11B:
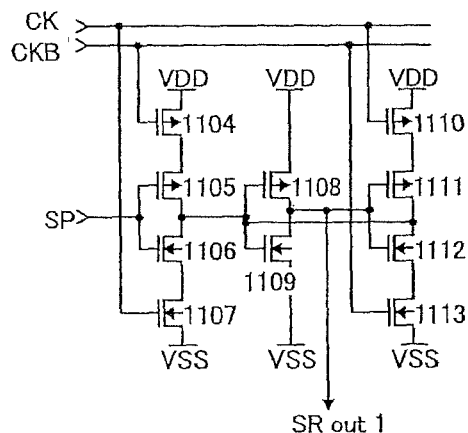
Figure 11C:
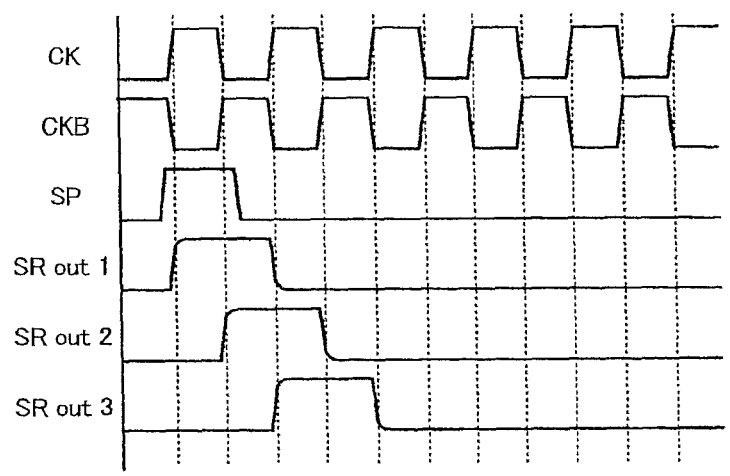

FIG. 8G illustrates a portable phone comprising a body 3061, a sound output portion 3062, a sound input portion 3063, a display portion 3064, an operation switch 3065 and an antenna 3066. The invention can be applied to the display portion 3064.

It should be noted that the examples shown in this embodiment are only a part and the use of the invention is not limited to the above.

In accordance with the invention, a drive circuit and a pixel portion of a display device can only comprise single conductive TFTs and reducing processes for manufacturing the display device contributes to reduce of a cost and improvement of a yield, so that it would be possible to provide the display device at a lower price.

What is claimed is:

1. A semiconductor device comprising:
   a first transistor;
   a second transistor;
   a third transistor;
   a fourth transistor;
   a fifth transistor;
   a sixth transistor;
   a seventh transistor; and
   an eighth transistor,
   wherein one of a source and a drain of the first transistor and one of a source and a drain of the second transistor are electrically connected to a first line,
   wherein a gate electrode of the first transistor is electrically connected to one of a source and a drain of the fifth transistor and one of a source and a drain of the sixth transistor,
   wherein a gate electrode of the second transistor is electrically connected to one of a source and a drain of the third transistor and one of a source and a drain of the fourth transistor, and
   wherein a gate electrode of the third transistor is electrically connected to one of a source and a drain of the seventh transistor and one of a source and a drain of the eighth transistor.

2. The semiconductor device according to claim 1,
   wherein the first transistor, the second transistor, the third transistor, the fourth transistor, the fifth transistor, the sixth transistor, the seventh transistor, and the eighth transistor have a same conductive type, and
   wherein the same conductive type is a P-channel type.

3. The semiconductor device according to claim 1, wherein the semiconductor device is a liquid crystal display device.

4. The semiconductor device according to claim 1, wherein the other of the source and the drain of the third transistor is electrically connected to the other of the source and the drain of the fifth transistor.

5. The semiconductor device according to claim 1, wherein a gate electrode of the fourth transistor is electrically connected to a gate electrode of the fifth transistor.

6. The semiconductor device according to claim 1, wherein a gate electrode of the sixth transistor is electrically connected to the gate electrode of the third transistor.

7. The semiconductor device according to claim 1,
   wherein a gate electrode of the seventh transistor is electrically connected to a third line,
   wherein the other of the source and the drain of the seventh transistor is electrically connected a fourth line,
   wherein a gate electrode of the eighth transistor is electrically connected to a fifth line, and
   wherein the other of the source and the drain of the eighth transistor is electrically connected a sixth line.

8. The semiconductor device according to claim 1, further comprising a pixel, wherein the pixel comprises a liquid crystal element and a ninth transistor.

9. The semiconductor device according to claim 1, wherein the first transistor, the second transistor, the third transistor, the fourth transistor, the fifth transistor, the sixth transistor, the seventh transistor, and the eighth transistor have a same conductive type, and wherein the same conductive type is an N-channel type.

10. The semiconductor device according to claim 1, wherein the first transistor, the second transistor, the third transistor, the fourth transistor, the fifth transistor, the sixth transistor, the seventh transistor, and the eighth transistor have a same conductive type.

11. The semiconductor device according to claim 1, wherein the other of the source and the drain of the first transistor is electrically connected to a second line to which a clock signal is supplied.

12. A semiconductor device comprising:
a first transistor;
a second transistor;
a third transistor;
a fourth transistor;
a fifth transistor;
a sixth transistor;
a seventh transistor; and
an eighth transistor,
wherein one of a source and a drain of the first transistor and one of a source and a drain of the second transistor are electrically connected to a first line,
wherein a gate electrode of the first transistor is electrically connected to one of a source and a drain of the fifth transistor and one of a source and a drain of the sixth transistor,
wherein a gate electrode of the second transistor is electrically connected to one of a source and a drain of the third transistor and one of a source and a drain of the fourth transistor,
wherein a gate electrode of the third transistor is electrically connected to one of a source and a drain of the seventh transistor and one of a source and a drain of the eighth transistor, and
wherein the other of the source and the drain of the second transistor is electrically connected to the other of the source and the drain of the fourth transistor.

13. The semiconductor device according to claim 12,
wherein the first transistor, the second transistor, the third transistor, the fourth transistor, the fifth transistor, the sixth transistor, the seventh transistor, and the eighth transistor have a same conductive type, and
wherein the same conductive type is a P-channel type.

14. The semiconductor device according to claim 12, wherein the semiconductor device is a liquid crystal display device.

15. The semiconductor device according to claim 12, wherein the other of the source and the drain of the third transistor is electrically connected to the other of the source and the drain of the fifth transistor.

16. The semiconductor device according to claim 12, wherein a gate electrode of the fourth transistor is electrically connected to a gate electrode of the fifth transistor.

17. The semiconductor device according to claim 12, wherein a gate electrode of the sixth transistor is electrically connected to the gate electrode of the third transistor.

18. The semiconductor device according to claim 12, wherein a gate electrode of the seventh transistor is electrically connected to a third line, wherein the other of the source and the drain of the seventh transistor is electrically connected a fourth line, wherein a gate electrode of the eighth transistor is electrically connected to a fifth line, and wherein the other of the source and the drain of the eighth transistor is electrically connected a sixth line.

19. The semiconductor device according to claim 12, further comprising a pixel,
wherein the pixel comprises a liquid crystal element and a ninth transistor.

20. The semiconductor device according to claim 12,
wherein the first transistor, the second transistor, the third transistor, the fourth transistor, the fifth transistor, the sixth transistor, the seventh transistor, and the eighth transistor have a same conductive type, and
wherein the same conductive type is an N-channel type.

21. The semiconductor device according to claim 12, wherein the first transistor, the second transistor, the third transistor, the fourth transistor, the fifth transistor, the sixth transistor, the seventh transistor, and the eighth transistor have a same conductive type.

22. The semiconductor device according to claim 12, wherein the other of the source and the drain of the first transistor is electrically connected to a second line to which a clock signal is supplied.

23. A semiconductor device comprising:
a first transistor;
a second transistor;
a third transistor;
a fourth transistor;
a fifth transistor;
a sixth transistor;
a seventh transistor; and
an eighth transistor,
wherein one of a source and a drain of the first transistor is electrically connected to one of a source and a drain of the second transistor,
wherein one of a source and a drain of the third transistor is electrically connected to a gate electrode of the first transistor and one of a source and a drain of the eighth transistor,
wherein one of a source and a drain of the fourth transistor is electrically connected to one of a source and a drain of the fifth transistor,
wherein one of a source and a drain of the sixth transistor is electrically connected a gate electrode of the fourth transistor and one of a source and a drain of the seventh transistor,
wherein a gate electrode of the second transistor is electrically connected to a gate electrode of the third transistor,
wherein a gate electrode of the fifth transistor is electrically connected to a gate electrode of the sixth transistor,
wherein a gate electrode of the seventh transistor is electrically connected to the other of the source and the drain of the seventh transistor, and
wherein the other of the source and the drain of the second transistor, the other of the source and the drain of the third transistor, the other of the source and the drain of the fifth transistor, and the other of the source and the drain of the sixth transistor are electrically connected to a first line.

24. The semiconductor device according to claim 23, further comprising a capacitor between the gate electrode of the first transistor and the one of the source and the drain of the first transistor.

25. The semiconductor device according to claim 23, wherein the other of the source and the drain of the first transistor is electrically connected to a second line.

26. The semiconductor device according to claim 23, wherein the other of the source and the drain of the fourth transistor is electrically connected to a third line.

27. The semiconductor device according to claim 23, wherein the other of the source and the drain of the eighth transistor is electrically connected to a fourth line.

28. The semiconductor device according to claim 23, wherein the first transistor, the second transistor, the third transistor, the fourth transistor, the fifth transistor, the sixth transistor, the seventh transistor, and the eighth transistor have a same conductive type.

29. The semiconductor device according to claim 23, wherein the first transistor, the second transistor, the third transistor, the fourth transistor, the fifth transistor, the sixth transistor, the seventh transistor, and the eighth transistor have a same conductive type, and
wherein the same conductive type is an N-channel type.

30. The semiconductor device according to claim 23, wherein the first transistor, the second transistor, the third transistor, the fourth transistor, the fifth transistor, the sixth transistor, the seventh transistor, and the eighth transistor have a same conductive type, and
wherein the same conductive type is a P-channel type.

31. The semiconductor device according to claim 23, further comprising a pixel,
wherein the pixel comprises a liquid crystal element and an ninth transistor.

32. The semiconductor device according to claim 23, wherein the semiconductor device is a liquid crystal display device.

* * * * *